United States Patent
Kim et al.

(10) Patent No.: US 9,082,504 B2
(45) Date of Patent: Jul. 14, 2015

(54) SEMICONDUCTOR MEMORY DEVICE STORING REFRESH PERIOD INFORMATION AND OPERATING METHOD THEREOF

(71) Applicant: Samsung Electronics Co., Ltd., Suwon-si (KR)

(72) Inventors: Jung-Sik Kim, Seoul (KR); Jung-Bae Lee, Seongnam-si (KR)

(73) Assignee: SAMSUNG ELECTRONICS CO., LTD., Yeongtong-gu, Suwon-si, Gyeonggi-do (KR)

( * ) Notice: Subject to any disclaimer, the term of this patent is extended or adjusted under 35 U.S.C. 154(b) by 145 days.

(21) Appl. No.: 13/936,057

(22) Filed: Jul. 5, 2013

(65) Prior Publication Data
US 2014/0016421 A1    Jan. 16, 2014

(30) Foreign Application Priority Data
Jul. 12, 2012    (KR) .......................... 10-2012-0076278

(51) Int. Cl.
| | | |
|---|---|---|
| *G11C 7/00* | (2006.01) | |
| *G11C 11/406* | (2006.01) | |
| *G11C 29/50* | (2006.01) | |
| *G11C 11/4076* | (2006.01) | |
| *G11C 11/40* | (2006.01) | |

(52) U.S. Cl.
CPC ................ *G11C 11/406* (2013.01); *G11C 7/00* (2013.01); *G11C 11/40618* (2013.01); *G11C 11/40622* (2013.01); *G11C 29/50016* (2013.01); *G11C 11/40* (2013.01); *G11C 11/4076* (2013.01)

(58) Field of Classification Search
CPC ........... G11C 11/406; G11C 11/40615; G11C 11/40618; G11C 11/40611; G11C 8/18; G11C 2211/4067; G11C 11/4076; G11C 7/22; G11C 8/10; G11C 7/1051
USPC ...................... 365/222, 233.1, 230.06, 230.08
See application file for complete search history.

(56) References Cited

U.S. PATENT DOCUMENTS

| | | | |
|---|---|---|---|
| 5,343,430 | A | 8/1994 | Furuyama |
| 5,859,801 | A | 1/1999 | Poechmueller |
| 6,178,479 | B1 | 1/2001 | Vishin |
| 6,697,909 | B1 | 2/2004 | Wang et al. |
| 7,286,433 | B2 | 10/2007 | Antretter et al. |
| 7,307,901 | B2 * | 12/2007 | Lovett ........................... 365/194 |

(Continued)

FOREIGN PATENT DOCUMENTS

| | | |
|---|---|---|
| JP | 05-109268 | 4/1993 |
| KR | 10-2005-0010655 A | 1/2005 |
| KR | 10-2011-0030779 A | 3/2011 |

*Primary Examiner* — David Lam
(74) *Attorney, Agent, or Firm* — Muir Patent Law, PLLC

(57) ABSTRACT

A semiconductor memory device which stores refresh period information thereby adjusting a refresh period and a method of operating the same. The semiconductor memory device includes a cell array and a refresh information storing unit. The cell array includes one or more cell regions each having a plurality of memory cells. The refresh information storing unit is configured to store first information including a first refresh period and second information including a second refresh period in correspondence to each of the cell regions. Memory cells included in each of the cell regions are refreshed at the first refresh period according to the first information in a first refresh time band and are refreshed at the second refresh period according to the second information in a second refresh time band.

20 Claims, 17 Drawing Sheets

(56) References Cited

U.S. PATENT DOCUMENTS

| | | | |
|---|---|---|---|
| 7,836,374 B2 | 11/2010 | Klein | |
| 8,036,060 B2 * | 10/2011 | Hayashi | 365/222 |
| 8,369,168 B2 * | 2/2013 | Walker | 365/203 |
| 8,724,416 B2 * | 5/2014 | Fujisawa | 365/222 |
| 2002/0023193 A1 | 2/2002 | Nakamura | |
| 2004/0221100 A1 | 11/2004 | Hong et al. | |
| 2005/0226073 A1 | 10/2005 | Lee | |
| 2008/0192557 A1 | 8/2008 | Casper | |
| 2009/0161456 A1 | 6/2009 | Sakakibara | |
| 2009/0238015 A1 | 9/2009 | Yeol Yang | |
| 2011/0055671 A1 | 3/2011 | Kim et al. | |
| 2011/0069572 A1 | 3/2011 | Lee et al. | |

* cited by examiner

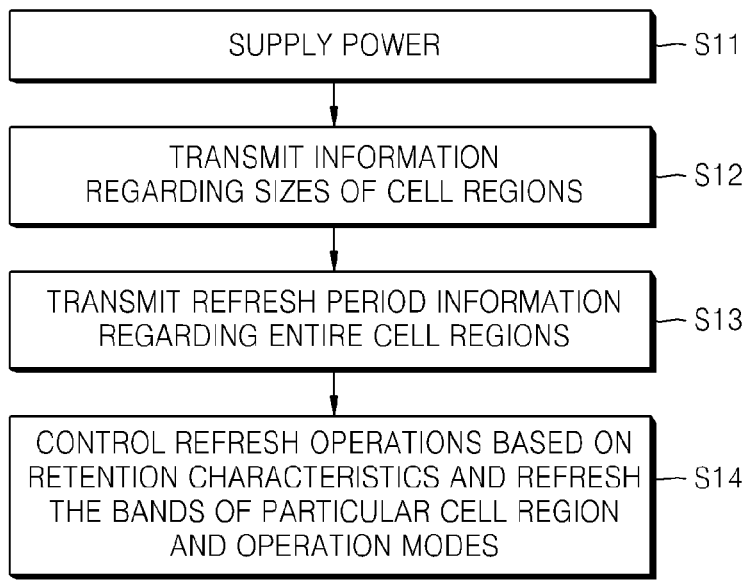
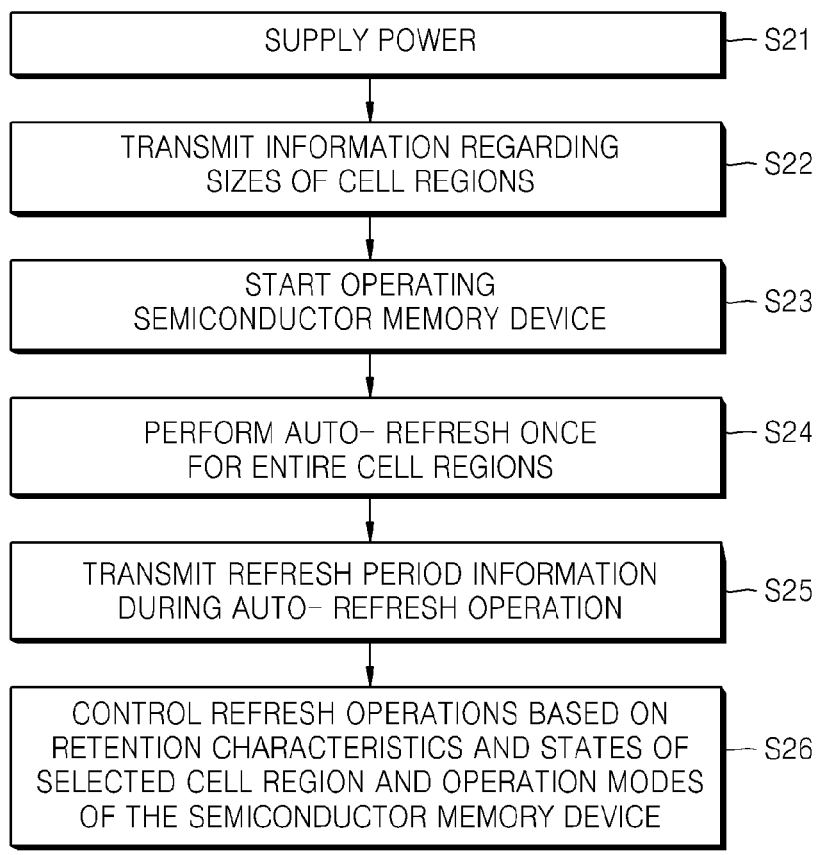

SEMICONDUCTOR MEMORY DEVICE STORING REFRESH PERIOD INFORMATION AND OPERATING METHOD THEREOF

CROSS-REFERENCE TO RELATED APPLICATIONS

This application claims the benefit of priority to Korean Patent Application No. 10-2012-0076278, filed on Jul. 12, 2012, in the Korean Intellectual Property Office, the disclosure of which is incorporated herein in its entirety by reference.

BACKGROUND

Variable example embodiments relate to a semiconductor memory device, and more particularly, to a semiconductor memory device which stores refresh period information thereby adjusting a refresh period and a method of operating the same.

Along with rapid developments in capacities and speeds of semiconductor memory devices widely used in electronic devices, power consumption of semiconductor memory devices is increasing. Particularly, in case of portable electronic devices, it is very important to reduce power consumption of semiconductor memory devices in the portable electronic devices.

For example, a dynamic random access memory (DRAM), which is a volatile semiconductor memory device, is a memory device which stores data by using charges stored in a capacitor. Since charges stored in a capacitor may be leaked in various ways as time passes, a DRAM has a finite data retention characteristic. To resolve the finite data retention, it is necessary for a DRAM to refresh periodically to charge/discharge a capacitor according to data stored in the DRAM.

In general, if a refresh period becomes shorter, power consumption is increased in refreshing a DRAM. Therefore, it may help to reduce power consumption by adjusting a refresh period.

SUMMARY

The present disclosure provides a semiconductor memory device, which manages memory cells or pages with weak characteristics separately to improve data retention characteristic and to reduce the overall refreshing frequency of the semiconductor memory device, and a method of operating the semiconductor memory device.

According to some embodiments, there is provided a semiconductor memory device including a cell array and a refresh information storing unit. The cell array includes one or more cell regions each having a plurality of memory cells. The refresh information storing unit is configured to store first information including a first refresh period, and second information including a second refresh period in correspondence to each of the cell regions. Memory cells included in each of the cell regions are refreshed at the first refresh period according to the first information in a first refresh time band and are refreshed at the second refresh period according to the second information in a second refresh time band.

According to one embodiment, there is provided a semiconductor memory device including a cell array, a refresh information storing unit, a refresh counter, and an address selecting unit. The cell array includes one or more cell regions each having a plurality of memory cells. The refresh information storing unit is configured to store information regarding refresh periods corresponding to the respective cell regions. The refresh counter is configured to output a first address for refreshing a first memory cell included in a first cell region of the cell array when the semiconductor memory device receives a first command. The address selecting unit is configured to select a second address received from outside the semiconductor memory device and to refresh a second memory cell included in a second cell region of the cell array different from the first cell region when the semiconductor memory device receives a second command. A first refresh period of the refresh periods corresponding to the first memory cell is greater than a second refresh period of the refresh periods corresponding to the second memory cell.

According to one embodiment, there is provided a semiconductor memory device including a cell array and a refresh information storing unit. The cell array includes one or more memory cell regions each having a plurality of memory cells. The refresh information storing unit is configured to store information including a plurality of retention characteristic values, each retention characteristic value indicating one or more bits, and indicating a first refresh period and a second refresh period greater than the first refresh period. Memory cells included in a first cell region of the cell regions are refreshed at the first refresh period and memory cells included in a second cell region of the cell regions are refreshed at the second refresh period.

BRIEF DESCRIPTION OF THE DRAWINGS

Exemplary embodiments will be more clearly understood from the following detailed description taken in conjunction with the accompanying drawings in which:

FIG. 10 is an exemplary flowchart showing a method of operating a memory system including a semiconductor memory device according to one embodiment;

FIG. 11 is an exemplary flowchart showing a method of operating a memory system according to one embodiment;

DETAILED DESCRIPTION OF THE EMBODIMENTS

Figure 1:
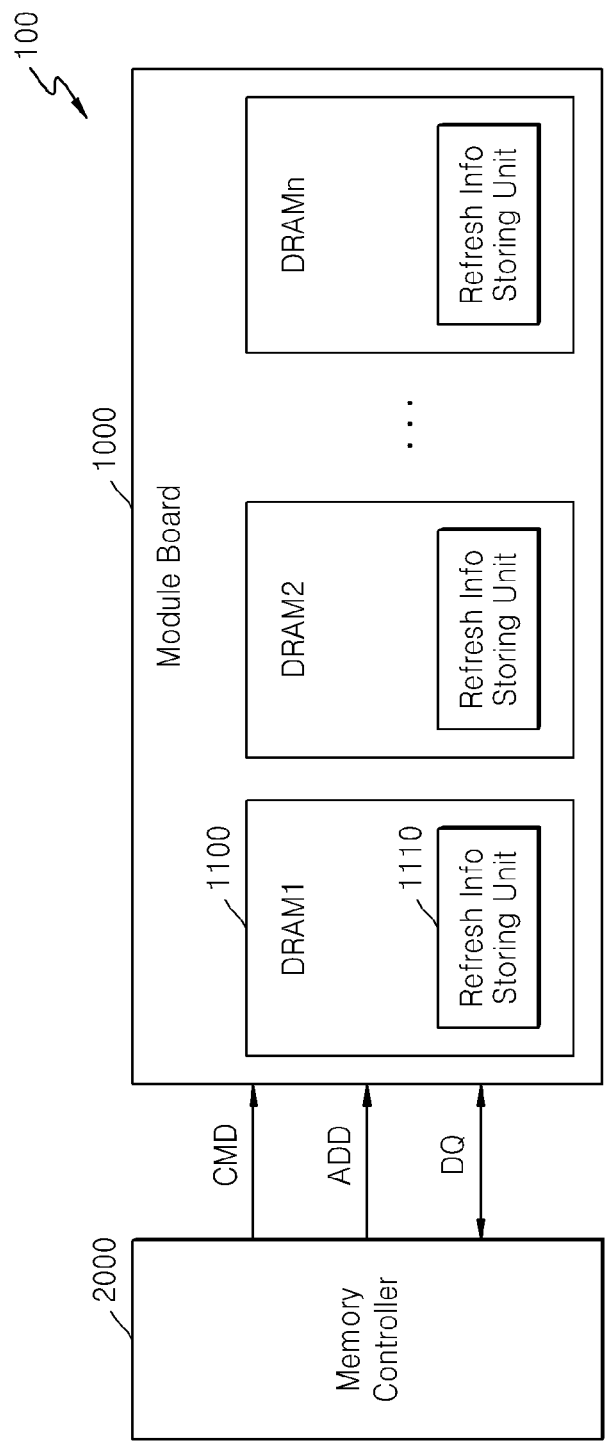
FIG. 1 is a block diagram showing a semiconductor memory device, a memory module, and a memory system according to some embodiments.

Example embodiments of the present disclosure now will be described more fully hereinafter with reference to the accompanying drawings, in which embodiments of the disclosure are shown. This disclosure may, however, be embodied in many different forms and should not be construed as limited to the embodiments set forth herein. In the drawings, the size and relative sizes of layers and regions may be exaggerated for clarity. Like numbers refer to like elements throughout.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms unless the context indicates otherwise. These terms are only used to distinguish one element from another. For example, a first signal could be termed a second signal, and, similarly, a second signal could be termed a first signal without departing from the teachings of the disclosure.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms such as "comprises," "comprising," "includes," and/or "including," when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and/or the present application, and will not be interpreted in an idealized or overly formal sense unless expressly so defined herein.

A dynamic random access memory (DRAM) is a semiconductor memory device having a finite data retention characteristic. Therefore, even validity of data stored in normal cells cannot be guaranteed after a specified period of time is elapsed. Therefore, a DRAM refreshes data stored in cells every specified time period, where the time period is referred to as a specification period.

For example, a plurality of memory cells constituting a cell array of a DRAM may have data retention characteristics different from one another. It is generally necessary to refresh a weak cell having a weak retention characteristic more frequently than a normal cell, whereas a good cell having an excellent retention characteristic may have a longer refresh period than the normal cell. Furthermore, data retention characteristics may vary according to operation state of cells. The specification period may be determined on the basis of the refresh frequency of the weak cell.

Hereinafter, reduction of the overall refreshing frequency of a semiconductor memory device by storing information regarding a plurality of refreshing frequencies according to retention characteristics and operating states of cells and separately refreshing weak cells having weak data retention characteristics by using the stored refreshing frequency information according to embodiments of the disclosure will be described.

FIG. 1 is a block diagram showing a semiconductor memory device 1100, a memory module 1000, and a memory system 100 according to some embodiments. As shown in FIG. 1, the memory system 100 includes the memory module 1000 and a memory controller 2000. The memory module 1000 includes one or more semiconductor memory devices 1100 mounted on a module board. For example, the semiconductor memory device 1100 may be a DRAM chip. The DRAM chip includes a cell array in which a plurality of DRAM cells are arranged in an array shape. Hereinafter, it is assumed that the semiconductor memory device 1100 is a DRAM chip.

The memory controller 2000 provides various signals for controlling the semiconductor memory devices 1100 arranged in the memory module 1000 and communicates with the memory module 1000 to provide a data signal DQ to the semiconductor memory devices 1100 or to receive a data signal DQ from the semiconductor memory devices 1100. Each semiconductor memory device 1100 includes a cell array, and the cell array may include one or more cell regions. For example, the cell array may include a plurality of memory banks, and each of the memory banks may include a plurality of pages. A page may be defined as the unit of data storage that is accessed based on a particular row address.

According to one embodiment, the semiconductor memory device 1100 may include a refresh information storing unit 1110 (e.g., a refresh information storing circuit including one or more fuse array, one or more registers and/or other circuit elements for storing data) which stores information regarding refreshing of cells or cell regions. To determine retention characteristics of cell regions, each of one or more cell regions of a cell array may be tested, and the refresh information storing unit 1110 stores results of testing cells or cell regions. When the memory system is driven, refresh information stored in the refresh information storing unit 1110 may be transmitted from the semiconductor memory device 1100 to the memory controller 2000.

The unit of the above-stated cell regions may be defined in various forms. For example, a single page may be defined as the unit of the cell regions, or two or more pages may be defined as the unit of the same cell regions. In certain embodiments described further below, a unit of the cell regions may be designated to be refreshed at a refresh interval (e.g., 7.8 us, 15.6 us, or the like) during a single refresh period. (e.g., 64 ms, 128 ms, or the like). Furthermore, refresh information stored in the refresh information storing unit 1110 may be information regarding refresh periods of respective cell regions. In one embodiment, information regarding a refresh period of a cell region may be determined based on the status of a cell having the poorest data retention characteristics in the corresponding cell region.

Figure 2A:
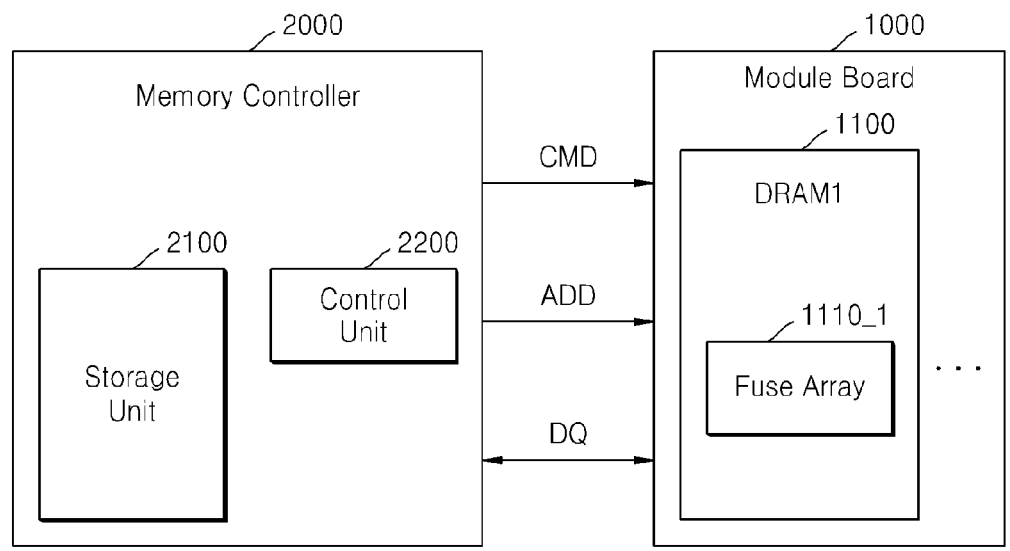
FIGS. 2A through 2C are diagrams showing examples of the refresh information storing unit of FIG. 1 and examples of the memory controller based on the same according to some embodiments.
Figure 2B:
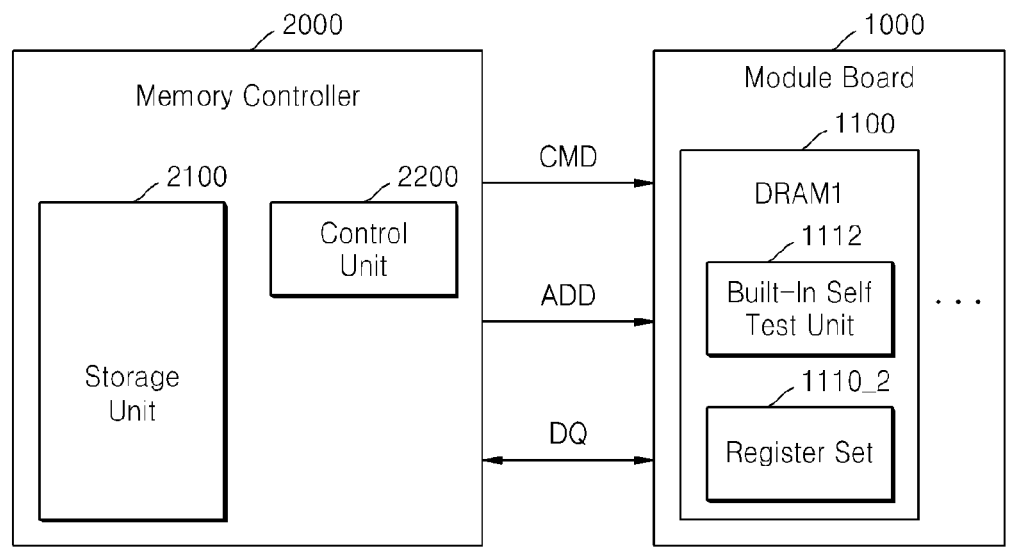
Figure 2C:
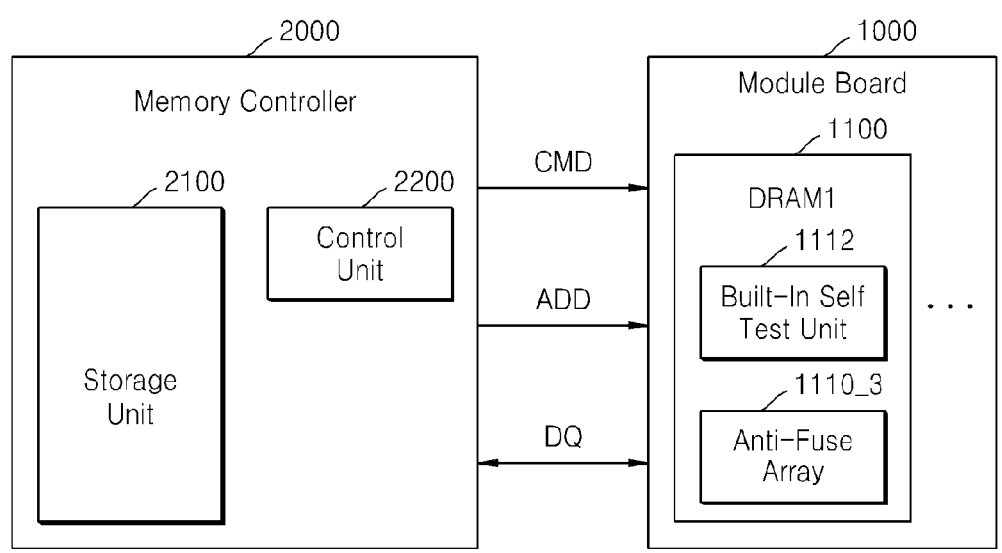

FIGS. 2A through 2C are diagrams showing examples of the refresh information storing unit 1110 of FIG. 1 and examples of the memory controller 2000 based on the same according to some embodiments. The refresh information storing unit 1110 may be embodied in any of various forms, e.g., an anti-fuse array, a fuse array, or a register set. The memory controller 2000 may include a storage unit 2100 which stores refresh period information received from the semiconductor memory device 1100 and a control unit 2200 which controls the overall operations of the memory controller 2000. The control unit 2200 may control the operation for storing refresh period information provided by the semiconductor memory device 1100 to the storage unit 2100.

For example, FIG. 2A shows the semiconductor memory device 1100 and the memory controller 2000 corresponding to a case in which the refresh information storing unit 1110 of FIG. 1 is embodied as a fuse array 1110_1. As shown in FIG. 2A, if the refresh information storing unit 1110 is embodied as the fuse array 1110_1, retention characteristics of cell regions are tested and a result thereof is stored in the fuse array 1110_1 while the semiconductor memory device 1100 is being manufactured. Since a fuse is non-volatile, the fuse array 1110_1 maintains data written thereto whether power is supplied or not.

For another example, FIG. 2B shows the semiconductor memory device 1100 and the memory controller 2000 corresponding to a case in which the refresh information storing unit 1110 of FIG. 1 is embodied as a register set 1110_2. As shown in FIG. 2B, if the refresh information storing unit 1110 is embodied as the register set 1110_2, the semiconductor memory device 1100 may include a built-in self test unit 1112 therein. When power is supplied to the memory device 1100, retention characteristics of cell regions of the semiconductor memory device 1100 are tested by the built-in self test unit 1112 in the semiconductor memory device 1100, and a result thereof may be stored in the register set 1110_2 of the semiconductor memory device 1100. Since a register is volatile, values stored in the register disappears when power supply is stopped. Therefore, when power is supplied to semiconductor memory device 1100, a result of tests performed by the built-in test unit 1112 may be stored in the register set 1110_2.

For another example, FIG. 2C shows the semiconductor memory device 1100 and the memory controller 2000 corresponding to a case in which the refresh information storing unit 1110 of FIG. 1 is embodied as an anti-fuse array 1110_3. As shown in FIG. 2C, if the refresh information storing unit 1110 is embodied as the anti-fuse array 1110_3, the semiconductor memory device 1100 may include the built-in self test unit 1112 therein. Since the anti-fuse array 1110_3 is non-volatile, values stored in the anti-fuse array 1110_3 are maintained whether power is supplied or not. Therefore, when the memory system 100 of FIG. 1 updates retention characteristics of cell regions of the semiconductor memory device 1100, retention characteristics of the cell regions of the semiconductor memory device 1100 are tested by the built-in self test unit 1112, and values stored in the anti-fuse array 1110_3 of the semiconductor memory device 1100 may be changed.

Figure 3:
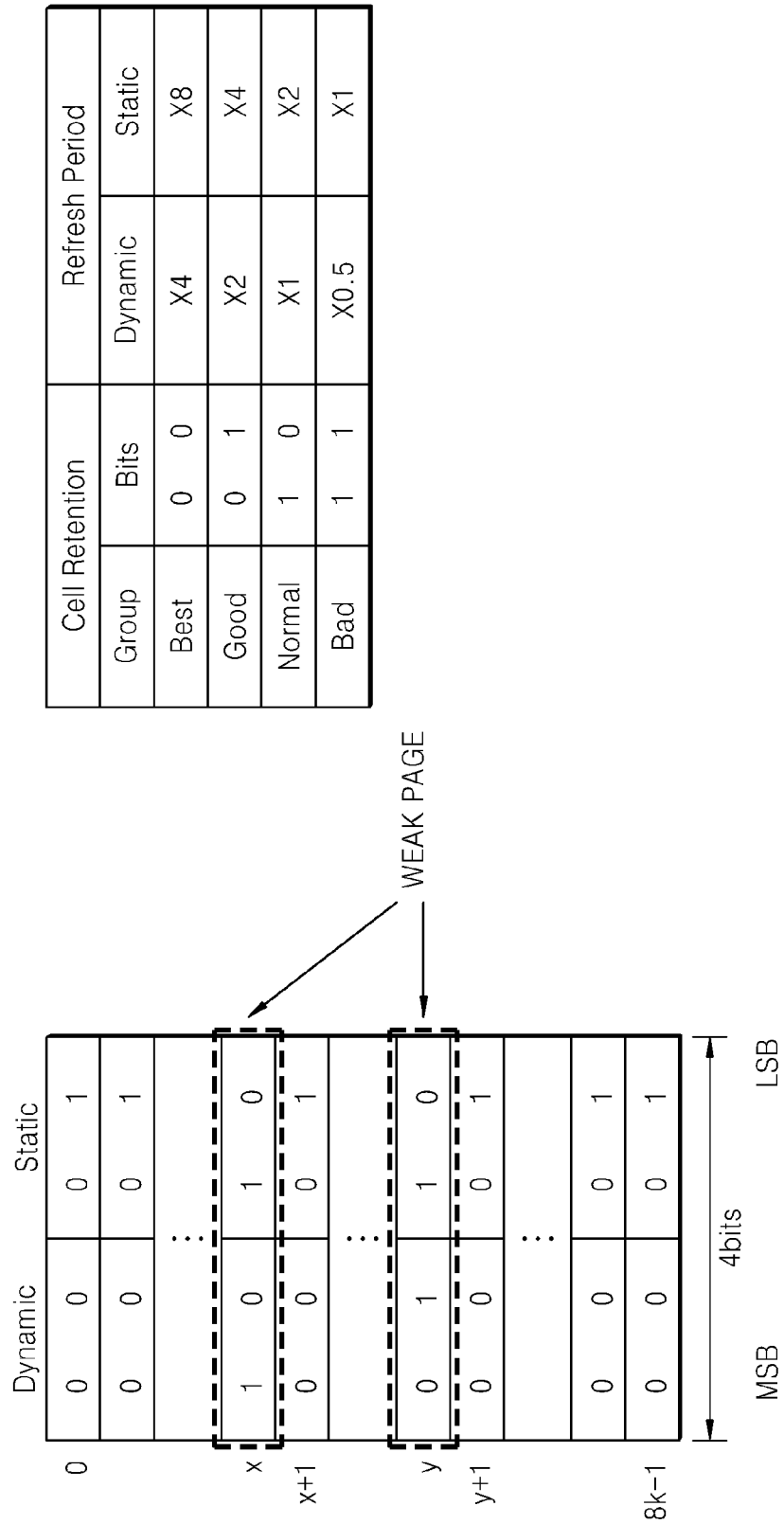
FIG. 3 shows an example of information stored in the refresh information storing unit of FIG. 1 according to one embodiment.

FIG. 3 shows an example of information stored in the refresh information storing unit 1110 of FIG. 1 according to one embodiment. The refresh information storing unit 1110 may store at least two pieces of information regarding each of one or more cell regions. For example, the refresh information storing unit 1110 may store information regarding respective refresh periods according to states of memory cells included in cell regions or refreshing modes of the semiconductor memory device 1100. The cell states of a cell region may indicate whether cells of the cell region are in a dynamic state or a static state. Furthermore, the refreshing modes of the semiconductor memory device 1100 may indicate an auto-refreshing mode and a self-refreshing mode.

According to the cell states or the refreshing modes, an arbitrary cell region operates during a first refresh time band or a second refresh time band. The refresh information storing unit 1110 stores first information indicating refresh periods of each of cell regions during the first refresh time band and second information indicating refresh periods of each of the cell regions during the second refresh time band. For example, in FIG. 3, the first refresh time band is a period in which a refresh operation is performed when a cell region is in a dynamic state, whereas the second refresh time band is a period in which a refresh operation is performed when a cell region is in a static state.

An address for accessing the refresh information storage unit 1110 may be an address of a page or an address of a cell region including a plurality of pages. For example, FIG. 3 shows an example in which the first information and the second information are stored in correspondence to respective pages. Retention characteristics of memory cells of a cell region may be categorized into groups, for example four groups such as Best, Good, Normal, and Bad. The first information regarding retention characteristics of each of cell regions during the first refresh time band and the second information regarding retention characteristics of each of cell regions during the second refresh time band are stored in the refresh information storing unit 1110. For example, if the retention characteristic of memory cells of a particular cell region is "Best" during the first refresh time band, a value "00" may be stored as the first information. If the retention characteristic of memory cells of the particular cell region is "Good" during the second refresh time band, a value "01" may be stored as the second information. In one embodiment, the retention characteristic of memory cells of the particular cell region may be indicated by four bits representing two different time bands (e.g., in the dynamic and static states).

The refresh period of each of cell regions included in a cell array may be set based on a spec period provided by a specification (e.g., a user manual). For example, based on the data retention characteristic of memory cells of a cell region, the cell region may be refreshed at periods corresponding to an integer multiple of the spec period or an integer division of the spec period. Meanwhile, even if the first information and the second information regarding a cell region have a same bit value, the cell region may be refreshed at different refresh periods during the first refresh time band and the second refresh time band of the cell region. For example, FIG. 3 shows an example in which, when the first information and the second information regarding a cell region have a same bit value, the refresh period corresponding to the static state is twice as long as the refresh period corresponding to the dynamic state. As shown in FIG. 3, cell regions corresponding to addresses other than the addresses "x" and "y" correspond to the value "00" and have a refresh period four times as long as the spec period, in the dynamic state. For example, a refresh period in the dynamic state may be referred to as a dynamic state refresh period and a refresh period in the static state may be referred to as a static state refresh period. Furthermore, the cell regions corresponding to addresses other than the addresses "x" and "y" correspond to the value "01" and have a refresh period four times as long as the spec period, in the static state. However, a page corresponding to the address "x" has a value "10" in the dynamic state and has a refresh period same as the spec period. Furthermore, the page corresponding to the address "x" has a value "10" in the static state and has a refresh period twice as long as the spec period. A page corresponding to the address "y" has values "01" and "10" respectively in the dynamic state and the static state and has a refresh period twice as long as the spec period in the both states.

Figure 4:
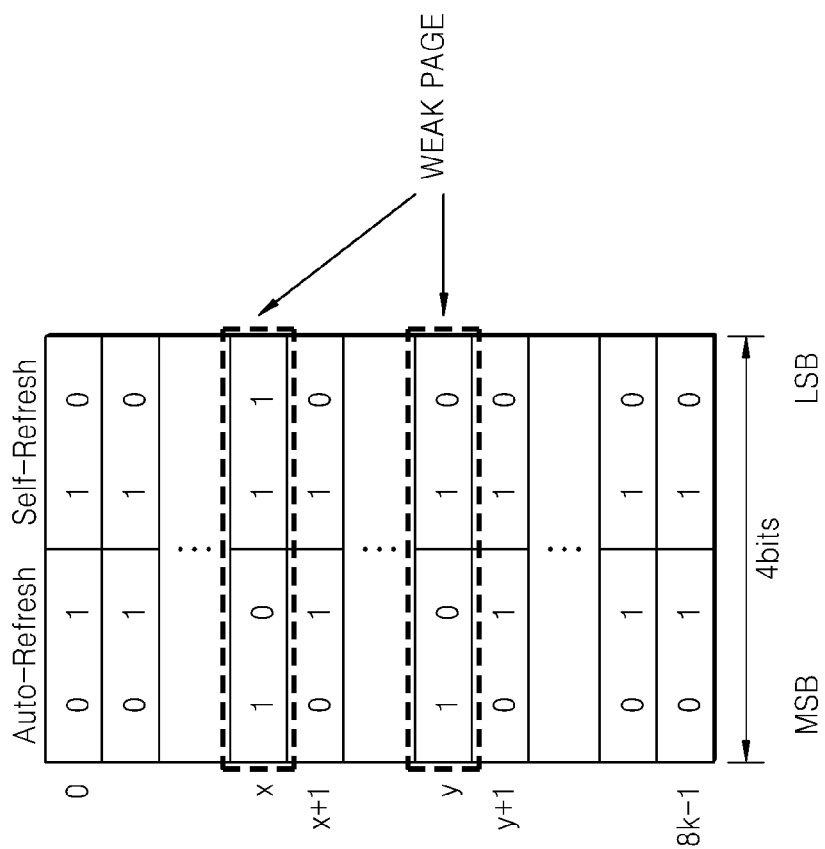
FIG. 4 shows another example of information stored in the refresh information storing unit of FIG. 1 according to one embodiment.

FIG. 4 shows another example of information stored in of refresh information storing unit 1110 of FIG. 1 according to one embodiment. FIG. 4 shows a case in which a refresh operation is performed in an auto-refresh mode during a first refresh time band of a cell region and a refresh operation is performed in a self-refresh mode during a second refresh time band. For example, cell regions corresponding to addresses other than the addresses "x" and "y" have values "01" and "10" respectively in the auto-refresh mode and the self-refresh mode and have a refresh period twice as long as the spec period. However, a page corresponding to the address "x" has values "10" and 11" respectively in the auto-refresh mode and the self-refresh mode and has a refresh period same as the spec period. A page corresponding to the address "x" has a value "10" in both the auto-refresh mode and the self-refresh mode and has a refresh period same as the spec period in the auto-refresh mode and a refresh period twice as long as the spec period in the self-refresh mode. In one embodiment, the retention characteristic of the particular cell region may be indicated by four bits representing two different time bands (e.g., in the auto-refresh and self-refresh modes).

In the above-described embodiments, the number of refresh time bands may be two or greater, and thus the number of pieces of refresh period information set in correspondence to each of the refresh time bands may be two or greater. Furthermore, retention characteristic of a cell region may be subdivided, and thus the number of groups of the retention characteristics may be four or greater. According to numbers of the refresh time bands and groups, storage capacity of the refresh information storing unit may be increased or decreased.

Figure 5:
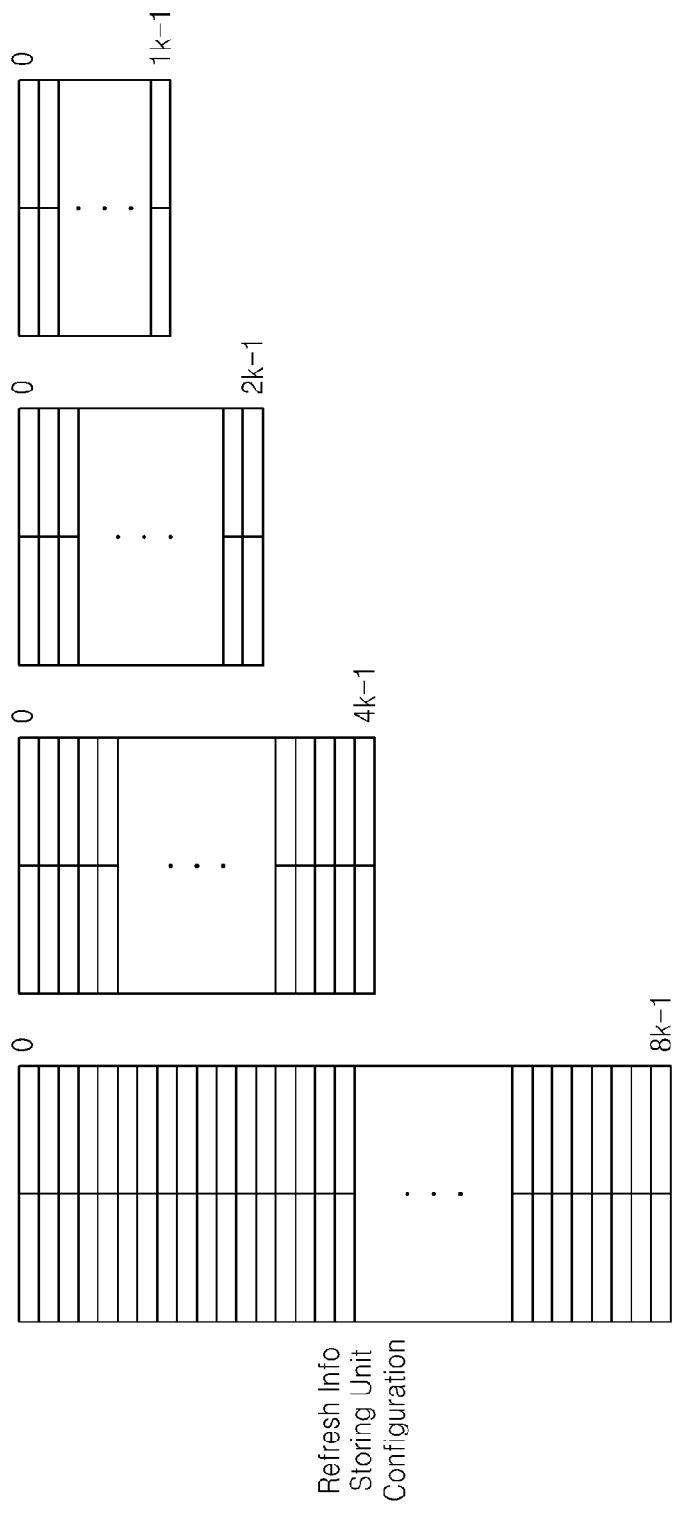
FIG. 5 shows an embodiment of a refresh information storing unit according to sizes of cell regions according to one embodiment.

FIG. 5 shows an embodiment of a refresh information storing unit according to sizes of cell regions according to one embodiment. Detailed description thereof will be given below with reference to FIGS. 1 and 5.

The semiconductor memory device 1100 may further include a storage unit (e.g., a storage circuit) which stores information regarding sizes of cell regions to be refreshed. The memory controller 2000 receives information regarding sizes of cell regions from the semiconductor memory device 1100 and adjusts respective refresh periods of the cell regions based on the sizes of the cell regions. A divided portion of a cell array may be defined as a sub-block, and the cell region described above in the previous embodiment may correspond to the sub-block.

For example, FIG. 5 shows an example of the refresh information storing unit 1110 in a case where the number of bits for indicating size of a sub-block is 2 and the number of pages is 8 k. If size of a sub-block corresponds to a single page, the memory controller 2000 may receive a value "00" as information regarding the size of the sub-block from the semiconductor memory device 1100 and recognize the size of the sub-block. When size of a sub-block corresponds to a single page, the refresh information storing unit 1110 may store retention characteristics regarding all pages. Meanwhile, in case where sizes of sub-blocks are respectively 2 pages, 4 pages, and 8 pages, storage capacity of the refresh information storing unit 1110 may decrease in inverse proportion to sizes of the sub-blocks. For example, if size of a sub-block corresponds to 8 pages, storage capacity of the refresh information storing unit 1110 may be one-eighth storage capacity in comparison with a case where size of the sub-block corresponds to a single page.

If size of a sub-block corresponds to 2 or more pages, the first information and the second information corresponding to each of cell regions stored in the refresh information storing unit 1110 may have values based on retention characteristics of a page with the weakest retention characteristics from among pages included in the sub-block.

Figure 6:
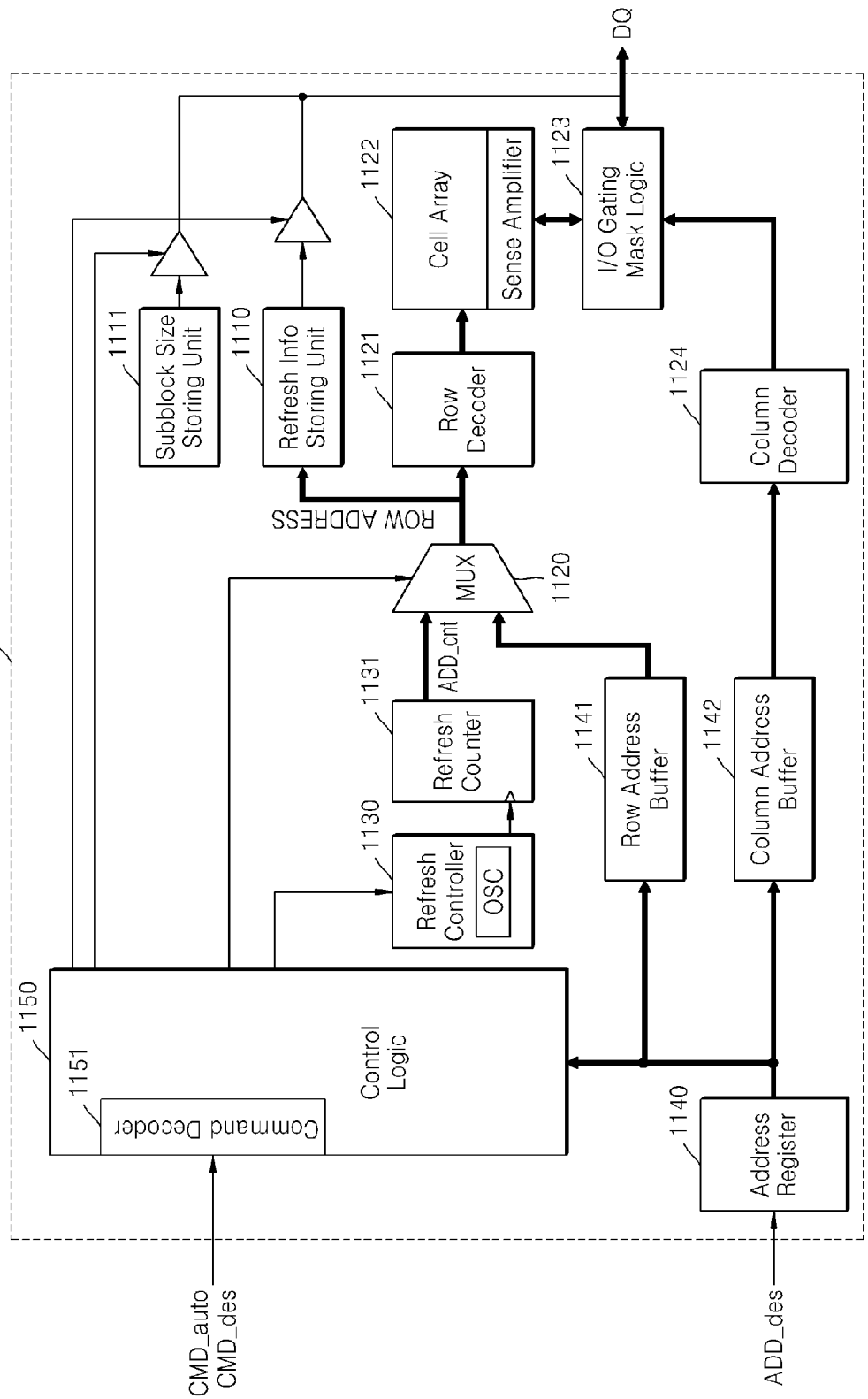
FIG. 6 is an exemplary block diagram showing an exemplary embodiment of the semiconductor memory device of FIG. 1.

FIG. 6 is an exemplary block diagram showing an exemplary embodiment of the semiconductor memory device 1100 of FIG. 1. As shown in FIG. 6, the semiconductor memory device 1100 may include a refresh information storing unit 1110, a sub-block size storing unit 1111, a multiplexer 1120, a row decoder 1121, a cell array 1122, an input/output gating mask logic 1123, a column decoder 1124, a refresh controller 1130, a refresh counter 1131, an address register 1140, a row address buffer 1141, a column address buffer 1142, and a control logic 1150.

The first information and the second information regarding cell regions may be stored in the refresh information storing unit 1110, whereas the sub-block size storing unit 1111 may store information regarding sizes of sub-blocks corresponding to the cell-regions to be refreshed during a single refresh period. Information stored in the refresh information storing unit 1110 and the sub-block size storing unit 1111 may be provided to a memory controller. For example, the information may be output to the memory controller via an input/output path of a data signal DQ. An output of the multiplexer 1120 is input to the row decoder 1121 and the refresh information storing unit 1110 as a row address signal. The row decoder 1121 drives a word line and selects a cell region of the cell array 1122 (e.g., a page). Data stored in the selected cell region is read out and provided to a sense amplifier, and an output of the sense amplifier is provided to the input/output gating mask logic 1123. The input/output gating mask logic 1123 receives an output of the column decoder 1124 and selects data to be input/output as data signals DQ.

The multiplexer 1120 receives outputs of the refresh counter 1131 and the row address buffer 1141 that are controlled by the refresh controller 1130 and outputs a row address signal. The refresh counter 1131 performs a counting operation in response to an auto-refresh command received from the memory controller or outputs a counting address ADD_cnt by performing a counting operation in response to a clock signal received from an internal oscillator in the self-refresh mode. An address received from the memory controller is provided to the row address buffer 1141 and the column address buffer 1142 via the address register 1140. Components of the semiconductor memory device 1100 operate according to control signals output by the control logic 1150 based on commands received from the memory controller.

An operation for adjusting refresh periods of cell regions according to some embodiments may be performed as described below.

The semiconductor memory device 1100 receives at least one command from the memory controller for performing a refresh operation. For example, auto-refresh commands CMD_auto are periodically received from the memory controller at a predetermined refresh period. In response to the auto-refresh commands CMD_auto, the refresh counter 1131 performs a counting operation and outputs a counting address ADD_cnt as a result of the counting operation. The multiplexer 1120 provides the counting address ADD_cnt to the row decoder 1121 as a row address under the control of the control logic 1150. Therefore, a selected cell region of the cell array 1122 is refreshed.

During an auto-refresh operation as described above, a command for refreshing a particular cell region is received from the memory controller. A refresh command regarding the particular cell region may be defined as a designated refresh command CMD_des, and a designated address ADD_des for designating a particular cell region is received together with the designated refresh command CMD_des. The designated address ADD_des is provided to the row decoder 1121 via the row address buffer 1141 and the multiplexer 1120. Therefore, a refresh operation to a designated cell region is additionally performed.

During the auto-refresh operation, each of auto-refresh commands CMD_auto may input periodically at a predetermined refresh period, and at least one particular cell region is refreshed according to the designated refresh command CMD_des during a time period between the predetermined refresh periods. As such, according to retention characteristics of cell regions stored in the refresh information storing unit 1110, refresh frequencies of cell regions with relatively low data retention characteristics are increased, so that cell regions with different retention characteristics are respectively refreshed at different refresh periods.

In certain embodiments, all memory cells included in a particular cell region of the cell array may be refreshed during a single refresh period (e.g., 64 ms, 128 ms, or the like) and each of the memory cells may be refreshed once at a predetermined refresh period interval within the single refresh period.

In one embodiment, for example, during the auto-refresh operation, if a first memory cell included in a first cell region of the cell array has a weak retention characteristic, the first memory cell may be refreshed more frequently (e.g., twice) during the single refresh period in response to the designated refresh command CMD_des and a first address received from the controller and corresponding to the first memory cell.

Figure 7:
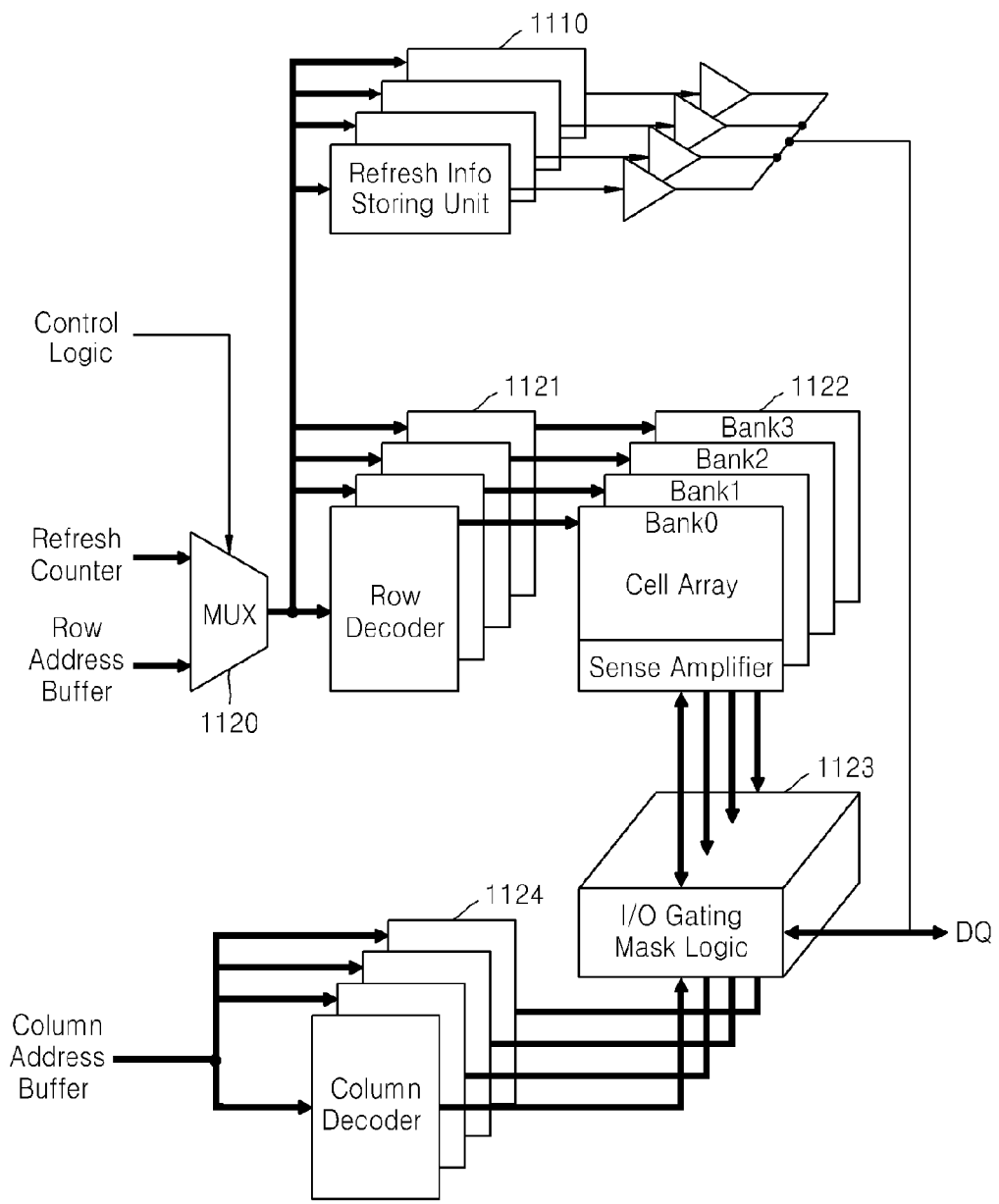
FIG. 7 is a block diagram showing an example in which a cell array includes a plurality of banks in the semiconductor memory device of FIG. 6 according to one embodiment.

FIG. 7 is a block diagram showing an example in which a cell array includes a plurality of banks in the semiconductor memory device 110 of FIG. 6 according to one embodiment. The cell array 1122 may include a plurality of banks. The semiconductor memory device 1100 may receive bank addresses and perform input, output, and refresh operations individually with respect to each of the banks. For example, FIG. 7 shows an example of the cell array 1122 including 4 banks. In FIG. 7, an output of the row decoder 1121 may be input to the plurality of banks constituting the cell array 1122, and inputs/outputs of the respective banks may be selected by the input/output gating mask logic 1123 according to column addresses.

Furthermore, cell regions corresponding to refresh period information stored in the refresh information storing unit 1110 may exist in every bank. As shown in FIG. 7, the refresh information storing unit 1110 may store refresh period information corresponding to a cell region of each of the banks, in which the refresh period information is categorized according to the banks including the cell array 1122. In the above embodiment, the number of the banks may be four or greater, and thus the refresh information storing unit 1110 may be categorized into the number of the banks.

Figure 8:
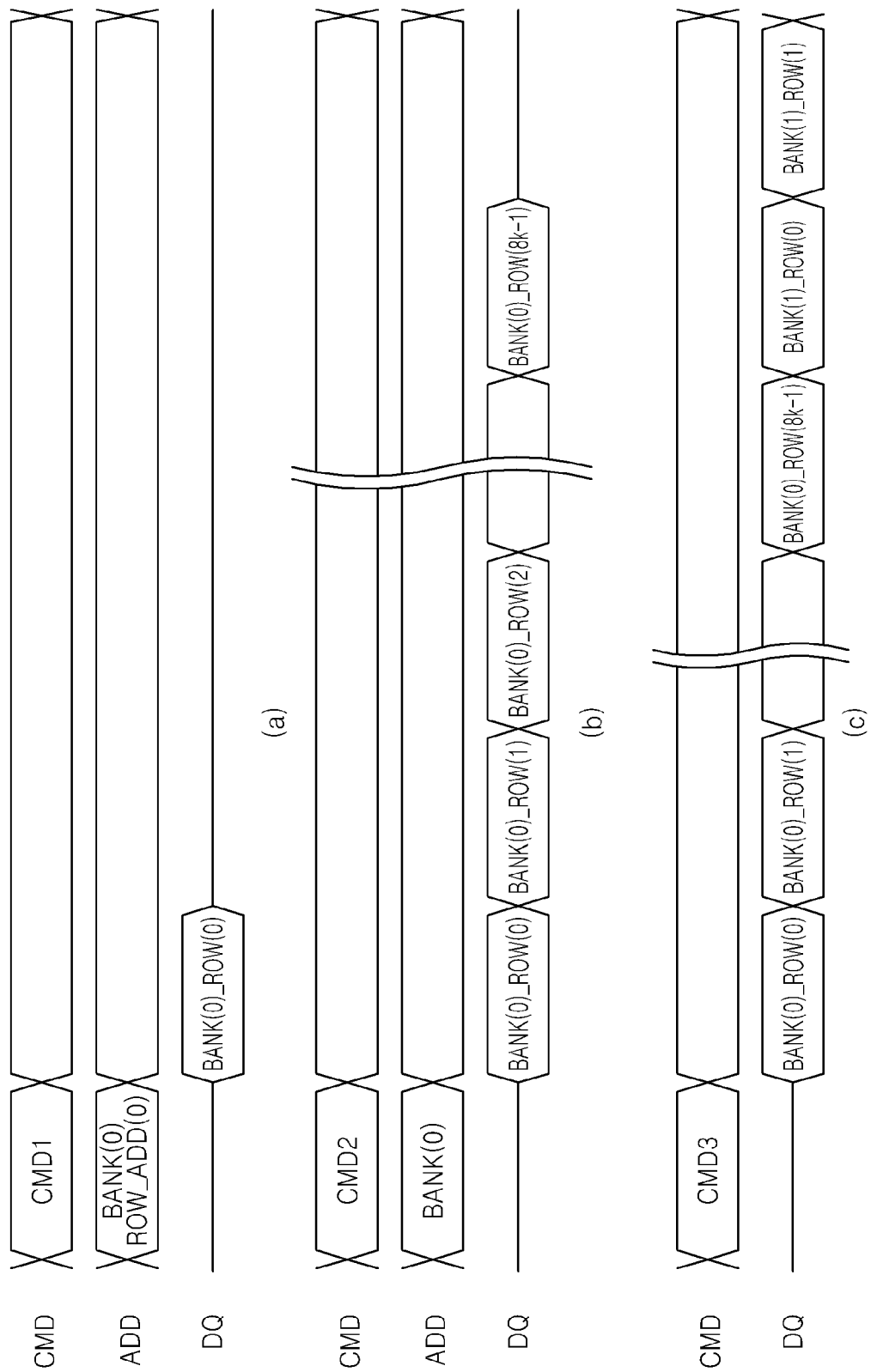
FIG. 8 is a diagram showing an example of operations for outputting information stored in the refresh information storing unit of FIG. 6 to outside according to some embodiments.

FIG. 8 is a diagram showing an example of operations for outputting information stored in the refresh information storing unit 1110 of FIG. 6 to outside the semiconductor memory device 1100 according to some embodiments. Referring to FIGS. 6 and 8, the semiconductor memory device 1100 may receive inputs of bank addresses and row addresses from a memory controller according to commands from the memory controller. For example, FIG. 8 shows an example of an operation corresponding to a case in which the number of pages is 8 k.

As shown in a timing diagram (a) of FIG. 8, if the semiconductor memory device 1100 receives a bank address BANK(0) and a row address ROW_ADD(0) together with a first output command CMD1 from a memory controller, the multiplexer 1120 selectively outputs the row address ROW_ADD(0) under the control of the control logic 1150. The output row address ROW_ADD(0) is input to the refresh information storing unit 1110 as address, and refresh period information corresponding to the bank address BANK(0) and the row address ROW_ADD(0) that are input by the memory controller is output via the input/output path of the data signal DQ.

According to another embodiment, as shown in a timing diagram (b) of FIG. 8, if the semiconductor memory device 1100 receives the bank address BANK(0) together with a second output command CMD2 from the memory controller, the multiplexer 1120 bypasses an output of the refresh counter 1131 under the control of the control logic 1150. An output of the refresh counter 1131 may be a counting address ADD_cnt for sequentially selecting cell regions of the cell array 1122. Therefore, refresh period information corresponding to the respective cell regions stored in the refresh information storing unit 1110 may be sequentially output, and refresh period information corresponding to the bank address BANK(0) input by the memory controller may be output via the input/output path of the data signal DQ.

According to another embodiment, as shown in a timing diagram (c) of FIG. 8, if the semiconductor memory device 1100 receives a third output command CMD3 from the memory controller, the multiplexer 1120 may bypass an output of the refresh counter 1131 under the control of the control logic 1150 in FIG. 6. As the refresh counter 1131 performs a counting operation, refresh period information stored in the refresh information storing unit 1110 corresponding to outputs of the refresh counter 1131 may be sequentially output. If a plurality of banks are arranged, refresh period information corresponding to a bank address determined by using one or more significant bits may be selected and output via the input/output path of the data signal DQ.

In the above embodiments, if a semiconductor device is a LPDDR2 DRAM, the first through third output commands CMD1, CMD2 and CMD3 may be ones of mode register read commands for reading values of a mode register, and the commands may be input to the semiconductor memory device 1100 via a command/address line. Furthermore, row addresses and bank addresses corresponding to the first output command CMD1 and the second output command CMD2 may be input to the semiconductor memory device 1100 via the command/address line after the first output command CMD1 and the second output command CMD2 are input.

Figure 9:
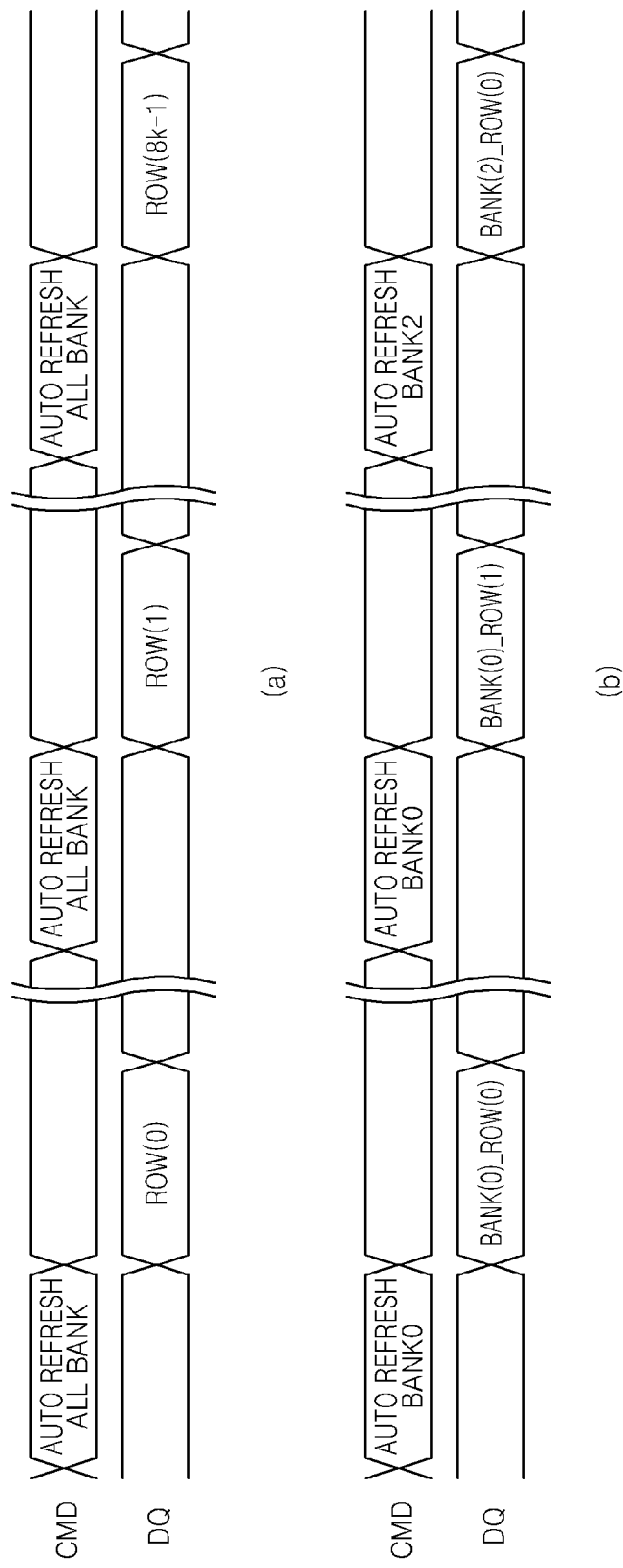
FIG. 9 is a diagram showing another example of operations for outputting refresh period information stored in the refresh information storing unit of FIG. 6 to outside according to some embodiments.

FIG. 9 is a diagram showing another example of operations for outputting refresh period information stored in the refresh information storing unit 1110 of FIG. 6 to outside the semiconductor memory device 1100 according to some embodiments. Referring to FIGS. 6 and 9, the semiconductor memory device 1100 may output refresh period information to the memory controller during an auto-refresh operation. Furthermore, a cell array of the semiconductor memory device 1100 may include a plurality of banks, where each of the banks may be individually refreshed according to commands input by the memory controller. For example, timing diagrams (a) and (b) of FIG. 9 show examples of auto-refresh operations in a case where a cell array includes 4 banks.

The timing diagram (a) of FIG. 9 shows an example operation in which an auto-refresh command regarding the entire banks is input by the memory controller. When an auto-refresh command regarding the entire banks is input by the memory controller, corresponding cell regions of each of the banks may be refreshed together in correspondence to row addresses output by the refresh counter 1131, and refresh period information stored in the refresh information storing unit 1110 in correspondence to the corresponding cell regions may be output via the input/output path of the data signal DQ.

The timing diagram (b) of FIG. 9 shows an example operation in which an auto-refresh command regarding a designated bank is input by the memory controller. When an auto-refresh command regarding a designated bank is input by the memory controller, a cell region of the designated bank may be refreshed in response to a row address output by the refresh counter 1131, and refresh period information stored in the refresh information storing unit 1110 in correspondence to the cell region may be output via the input/output path of the data signal DQ.

FIG. 10 is an exemplary flowchart showing a method of operating a memory system including a semiconductor memory device according to one embodiment. FIG. 10 shows an example in which power is supplied to the memory system and refresh period information regarding cell regions stored in the semiconductor memory device is transmitted to a memory controller.

As shown in FIG. 10, power is supplied to the memory system (operation S11). The semiconductor memory device transmits information regarding sizes of cell regions corresponding to refresh period information stored in a refresh information storing unit in response to commands from the memory controller (operation S12). Furthermore, the semiconductor memory device transmits refresh period information regarding the entire cell regions to the memory controller in response to commands from the memory controller (operation S13). The memory controller refers to the information regarding the refresh period information and the sizes of the cell regions received from the semiconductor memory device and controls refresh operations with respect to the semiconductor memory device according to data retention characteristics and operating time bands of the cell regions (operation S14). For example, refresh operation is controlled with one or more pages as the unit according to sizes of the cell regions. Furthermore, referring to the refresh period information regarding the respective cell regions, refresh periods of the cell regions are adjusted to have different values from one another. Furthermore, since the refresh period information may include first information and second information regarding a particular cell region, the refresh period of the particular cell region is adjusted, such that the particular cell region has a different refresh period from other cell regions based on retention characteristics and refresh time bands of the particular cell region of the semiconductor memory device. For example, memory cells included in the particular cell region may be in a dynamic state during a first refresh time band and may be in a static state during a second refresh time band. Furthermore, memory cells included in the particular cell region may be associated with an auto-refresh mode of the semiconductor memory device during a first refresh time band and may be associated with a self-refresh mode of the semiconductor memory device during a second refresh time band.

FIG. 11 is an exemplary flowchart showing a method of operating a memory system according to one embodiment. FIG. 10 is an example in which refresh period information regarding the entire cell regions is transmitted to the memory controller at once when the memory system is initiated is described. FIG. 11 is an example in which refresh period information regarding respective cell regions are transmitted to the memory controller at a distributed time while the initial auto-refresh operation is being performed.

As shown in FIG. 11, power is supplied to the memory system (operation S21). The semiconductor memory device transmits information regarding sizes of cell regions corresponding to stored refresh period information to the memory controller in response to commands of the memory controller (operation S22). Next, the semiconductor memory device starts general operations (e.g., storing/outputting data) (operation S23) and performs auto-refresh with respect to the entire cell regions of a cell array according to an auto-refresh command from the memory controller (operation S24). While the auto-refresh is being performed, the semiconductor memory device transmits refresh period information regarding the cell regions being refreshed to the memory controller via the input/output path of the data signal DQ (operation S25). For example, in response to an auto-refresh command, cell regions to be refreshed are selected via an internal counting operation. Furthermore, as a refresh information storing unit is accessed in the counting operation, refresh period information regarding particular cell region currently being refreshed is selected, and the selected refresh period information is provided to the memory controller. When the entire cell regions are auto-refreshed, the memory controller has refresh period information regarding the entire cell regions, and refresh operation of the semiconductor memory device is controlled based on retention characteristics and states (e.g., the dynamic state or the static state) of memory cells included in the selected cell region and operation modes (e.g., the auto-refresh mode or the self-refresh mode) of the semiconductor memory device (operation S26).

In embodiments shown in FIGS. 10 and 11, the refresh information storing unit 1110 in the semiconductor memory device 1100 is embodied as a register set and the semiconductor memory device 1100 may include the built-in self test unit 1112 as shown in FIG. 2B. For example, after power is supplied to the memory system 100, refresh period information regarding cell regions is generated via self testing operation of the built-in self test unit 1112, and the refresh period information may be stored in the refresh information storing unit 1110 of the semiconductor memory device 1100.

Figure 12:
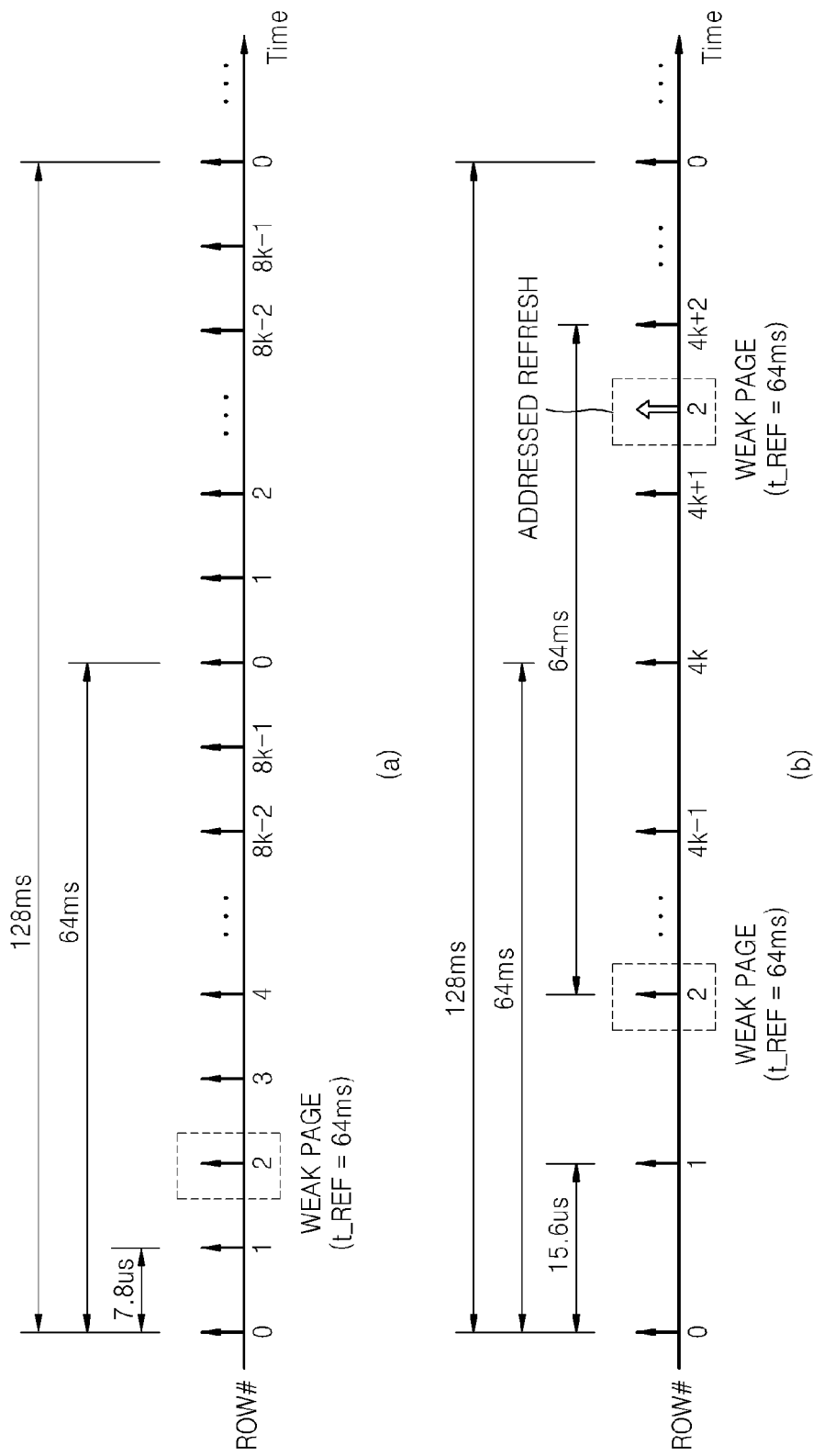
FIG. 12 is a diagram showing an example of refresh operations of a semiconductor memory device according to one embodiment.

FIG. 12 is a diagram showing an example of refresh operations of a semiconductor memory device according to one embodiment. The semiconductor memory device refreshes memory cells included in cell regions selected by an internal refresh counter in response to an auto-refresh command from the memory controller. As described above, the cell region may be defined as a region including one or more pages. Hereinafter, it is assumed that the cell region includes a single page.

For example, timing diagrams (a) and (b) of FIG. 12 show examples of refresh operations with respect to a semiconductor memory device, in which, based on refresh period information stored in a refresh information storing unit, a page corresponding to a row address "2" is a weak page having a refresh period of 64 ms, and the other pages have a refresh period of 128 ms. In other words, when refresh period information according to refresh modes is given as in FIG. 4 and spec period is 64 ms, the upper 2 bits of data of refresh period information regarding the weak page has a value "10," whereas the upper 2 bits of data of refresh period information regarding the other pages have a value "01." Furthermore, in the above embodiment, the total number of pages is 8 k, and thus a refresh counter outputs row addresses from 0 to 8 k−1.

The timing diagram (a) of FIG. 12 shows an operation that a semiconductor memory device is refreshed in response to an auto-refresh command from the memory controller. When auto-refresh commands are input by the memory controller at a refresh interval of 7.8 us, a refresh counter in the semiconductor memory device is operated, and pages corresponding to outputs of the refresh counter may be refreshed. The refresh interval of 7.8 us of the timing diagram (a) of FIG. 12 is decided based on the weak page "2".

The timing diagram (b) of FIG. 12 shows a refresh command according to one embodiment. The semiconductor memory device may receive a first command and a second command from the memory controller, where the second command may be accompanied by row address input. The first command is an auto-refresh command, where refresh operation is performed via a first address (e.g., the counting address ADD_cnt of FIG. 6) that is output by operating the refresh counter included in the semiconductor memory device of FIG. 6. The second command is an addressed refresh command, where a page corresponding to a second address (e.g., the designated address ADD_des of FIG. 6), which is input from the memory controller together with the second command, may be refreshed. An address selecting unit which selectively outputs the first address and the second address may correspond to the multiplexer 1120 included in the semiconductor memory device of FIG. 6. The multiplexer 1120 may selectively output the first address and the second address in response to receptions of the first command and the second command.

In the embodiment shown in the timing diagram (b) of FIG. 12, the pages other than the weak page may be refreshed at a refresh interval, for example, 15.6 us during a refresh period of 128 ms, whereas the weak page may have a refresh period of 64 ms according to the weak page address input twice during the refresh period of 128 ms. When a memory system is initiated, refresh period information is provided to the memory controller. Due to refresh adjusting operation of the memory controller via the first command and the second command, the cell regions of the semiconductor memory device may have refresh periods different from one another. As shown in the timing diagram (b) of FIG. 12, before 64 ms is elapsed since the weak page is refreshed according to an auto-refresh command, a refresh operation regarding the weak page may be performed by receiving inputs of an addressed refresh command and a second address from the memory controller. As such, during the refresh period of 128 ms, refresh operations may be performed for 16 k times in the example shown in the timing diagram (a) of FIG. 12, whereas refresh operations may be performed for 8 k+1 times in the example shown in the timing diagram (b) of FIG. 12.

In one embodiment, a plurality of weak pages may exist. Referring to respective refresh period information regarding the plurality of weak pages, the memory controller inputs addressed refresh commands and second addresses corresponding to the weak pages. As a result, the weak pages are refreshed more frequently, and thus the weak pages may store data stably.

Figure 13:
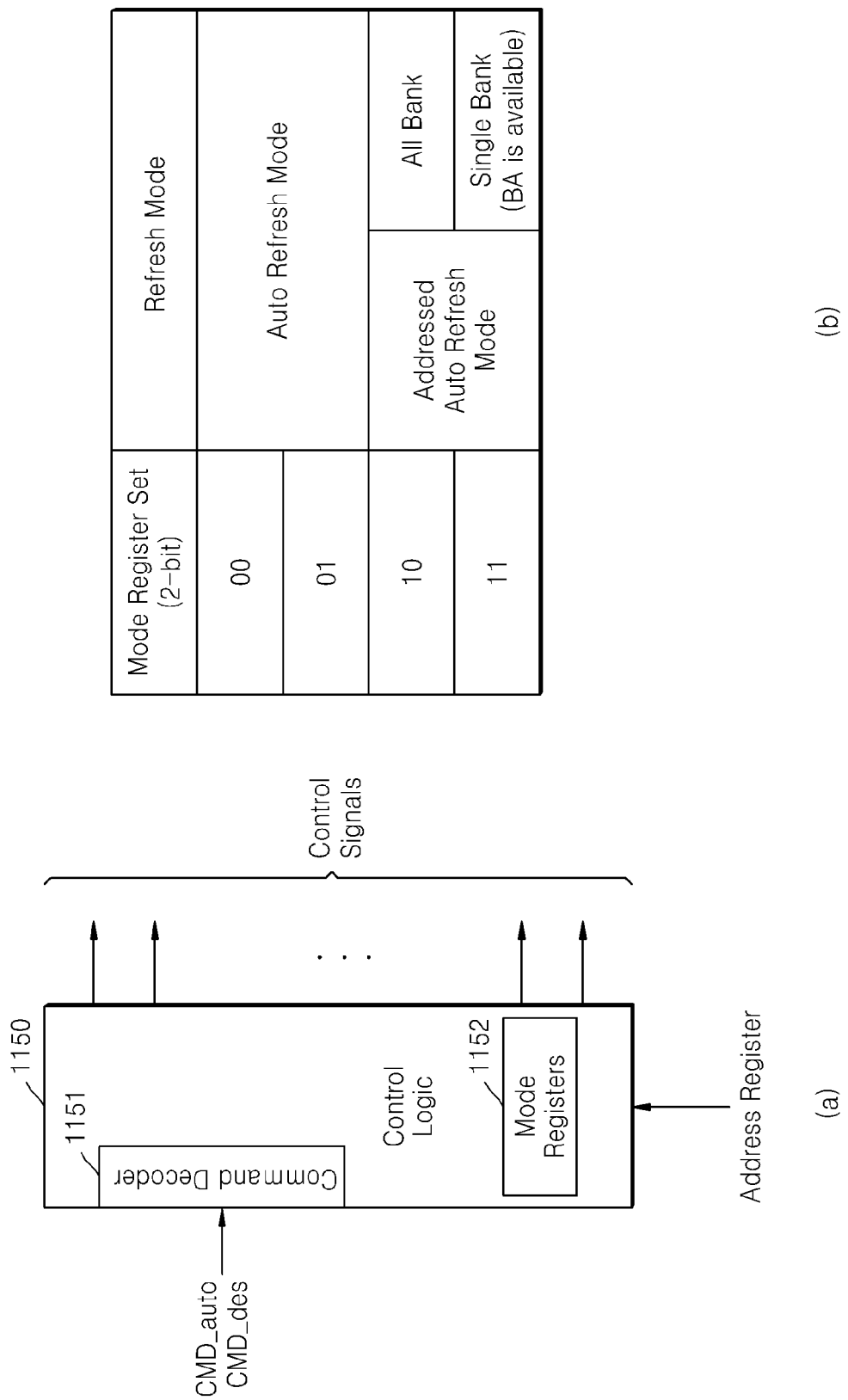
FIG. 13 is an exemplary block diagram showing an embodiment of the control logic of the semiconductor memory device of FIG. 6 according to one embodiment.

FIG. 13 is an exemplary block diagram showing an embodiment of the control logic 1150 of the semiconductor memory device of FIG. 6 according to one embodiment. As shown in a timing diagram (a) of FIG. 13, a command decoder 1151 receives a command from the memory controller and recognizes the received command. The control logic 1150 may include at least one mode register 1152 and may control operation of the semiconductor memory device by outputting control signals based on outputs of the command decoder 1151 and values of the mode register 1152. Values of the mode register 1152 may be changed via commands CMD and addresses ADD input by the memory controller.

In response to the commands of the memory controller, the semiconductor memory device may be in a first configuration, a second configuration, or a third configuration, where the configurations may be determined based on values of the mode register 1152. According to the first configuration, the control logic 1150 may block refresh operation whether a designated refresh command CMD_des is received or not. According to the second configuration, the control logic 1150 may refresh memory cells of cell regions included in a plurality of banks regardless of bank addresses of row address (e.g., the second address) input accompanying addressed refresh commands. According to the third configuration, the control logic 1150 may refresh memory cells of cell regions in response to both addressed refresh commands and addresses input accompanying the addressed refresh commands.

For example, as shown in a timing diagram (b) of FIG. 13, the first configuration applies when a value of 2 bits of data of the mode register 1152 is "00" or "01." In the first configuration, the control logic 1150 may refresh memory cells of cell regions whether addressed refresh commands are received or not. The second configuration applies when a value of 2 bits of data of the mode register 1152 is "10." In the second configuration, the control logic 1150 blocks bank addresses included in addresses input accompanying addressed refresh commands. As a result, memory cells of cell regions included in a plurality of banks may be refreshed regardless of bank addresses. The third configuration applies when a value of 2 bits of data of the mode register 1152 is "11." In the third configuration, the control logic 1150 responds to inputs of addressed refresh commands and addresses, and thus memory cells of cell regions corresponding to designated banks and row addresses may be refreshed. In the example shown in the timing diagram (b) of FIG. 13, the memory controller may set values of the mode register 1152 of the semiconductor memory device and may selectively perform a refresh operation with respect to a cell array.

Figure 14:
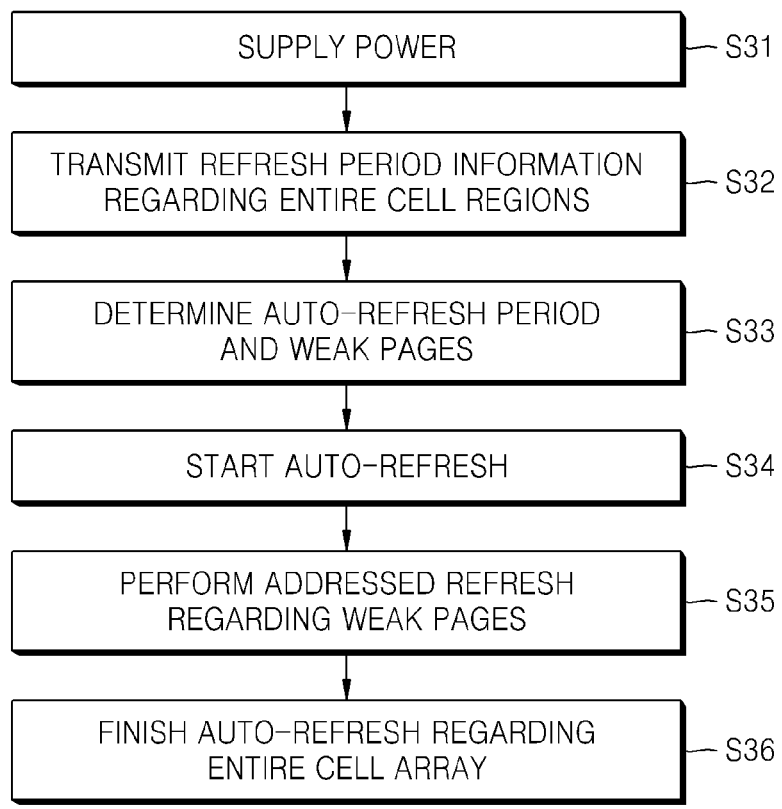
FIG. 14 is an exemplary flowchart showing a method of operating a memory system including a semiconductor memory device according to one embodiment.

FIG. 14 is an exemplary flowchart showing a method of operating a memory system including a semiconductor memory device according to one embodiment. When power is supplied to the memory system (operation S31), the semiconductor memory device transmits refresh period information regarding the entire cell regions to a memory controller (operation S32). The memory controller determines an auto-refresh period based on the refresh period information regarding the entire cell regions and determines weak pages which fail to satisfy the auto-refresh period (operation S33). The memory controller performs general operations with respect to the semiconductor memory device and outputs commands for performing an auto-refresh operation (operation S34). Furthermore, based on refresh period information regarding the weak pages, the memory controller outputs addressed refresh commands and addresses for designating the weak pages to the semiconductor memory device. Therefore, an addressed refresh operation is performed with respect to the weak pages while the semiconductor memory device is performing an auto-refresh operation (operation S35). When the entire cell regions are refreshed, one auto refresh period ends (operation S36). For later auto-refresh operations, the operations S34 through S36 may be repeatedly performed.

Figure 15:
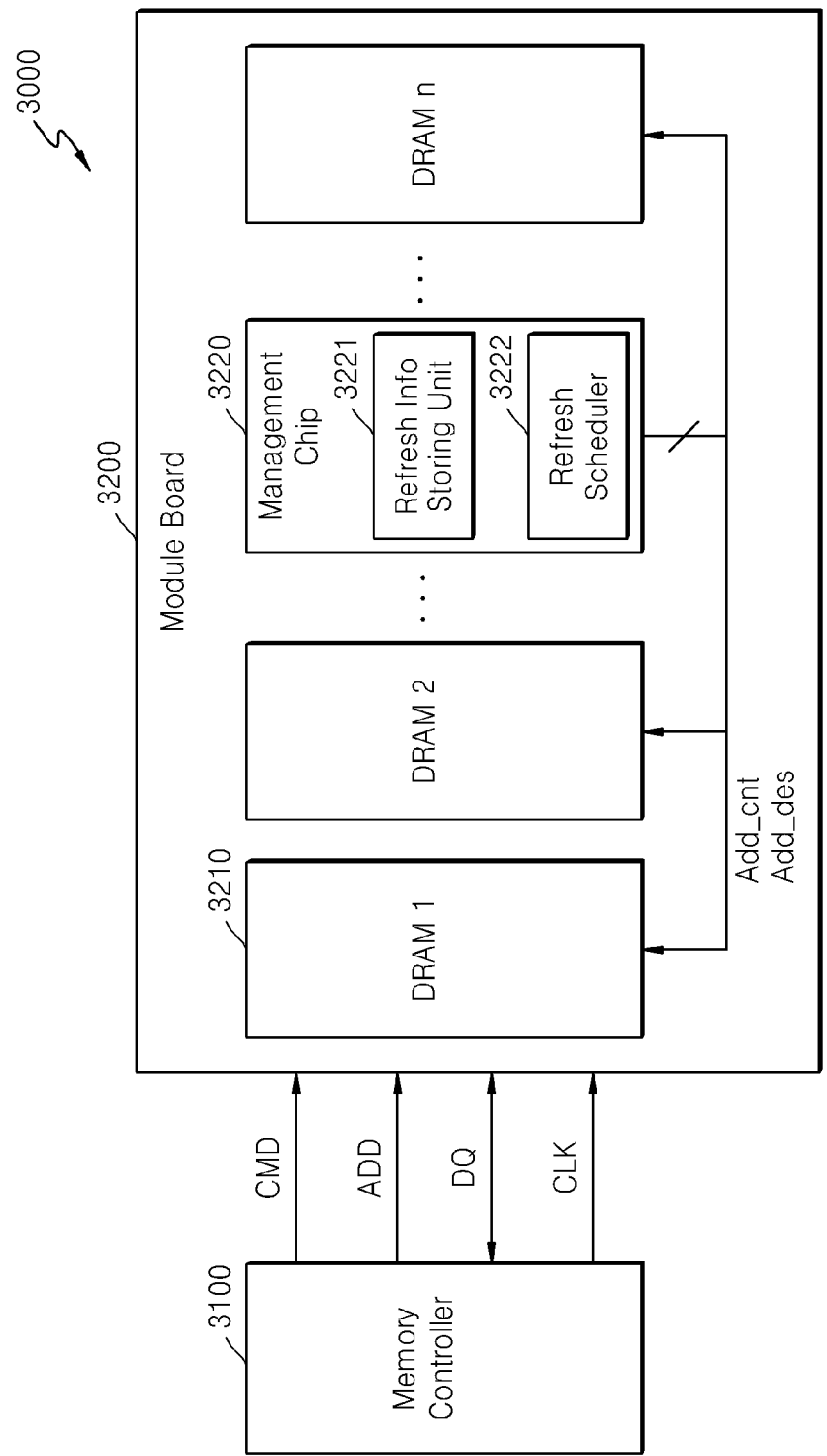
FIG. 15 is an exemplary block diagram showing a memory module and a memory system, according to one embodiment.

FIG. 15 is an exemplary block diagram showing a memory module 3200 and a memory system 3000, according to one embodiment. As shown in FIG. 15, the memory system 3000 according to one embodiment includes a memory controller 3100 and the memory module 3200. Furthermore, the memory module 3200 includes one or more semiconductor memory devices 3210 mounted on a module board. For example, the semiconductor memory device 3210 may be a DRAM chip. Furthermore, a memory management chip 3220 for managing memory operations of the semiconductor memory device 3210 may be further mounted on the module board.

The memory controller 3100 provides various signals for controlling the semiconductor memory device 3210 included in the memory module 3200, e.g., commands/addresses CMD/ADD and clock signals CLK, and communicates with the memory module 3200 to provide data signals DQ to the semiconductor memory device 3210 or receive data signals DQ from the semiconductor memory device 3210. The memory management chip 3220 manages memory operations of the semiconductor memory device 3210 and refresh operations according to the embodiment disclosed herein. For management of refresh operations, the memory management chip 3220 may include a refresh information storing unit 3221 (e.g., a refresh information storing circuit) and a refresh scheduler 3222.

The refresh information storing unit 3221 may store refresh information regarding cell regions included in the semiconductor memory device 3210 in a non-volatile manner. As described above, the refresh information storing unit 3221 may be embodied as a fuse array including fuses or anti-fuses. Information stored in the refresh information storing unit 3221 may be provided to the memory controller 3100 when the memory system 3000 is initiated.

In one embodiment, the refresh scheduler 3222 manages refresh operations of the semiconductor memory device 3210. For example, the refresh scheduler 3222 includes an address counter which performs a counting operation in response to an auto-refresh command received from the memory controller 3100. The refresh scheduler 3222 provides a counting address ADD_cnt output from the address counter to the semiconductor memory device 3210, such that selected cell regions are auto-refreshed. Furthermore, the refresh scheduler 3222 receives addressed refresh commands from the memory controller 3100 and designated addresses ADD_des therefor. As the addressed refresh commands are input, the refresh scheduler 3222 selectively outputs the designated address ADD_des to the semiconductor memory device 3210, so that particular regions of the semiconductor memory device 3210 are selected and refreshed.

Although, FIG. 15 shows an embodiment in which signals are transmitted between the memory controller 3100 and the memory module 3200 and between the semiconductor memory device 3210 and the memory management chip 3220 in the memory module 3200 via conductive lines, the disclosure is not limited thereto. For example, signal transmissions between the memory controller 3100 and the memory module 3200, signal transmissions between the semiconductor memory device 3210 and the memory management chip 3220, or signal transmissions among the plurality of semiconductor memory devices 3210 may be performed via optical input/output connections. For example, signals may be transmitted and received in a radiative interface using radio frequencies (RF) or ultrasound waves, an induced coupling interface using magnetic induction, or a non-radiative interface using magnetic field resonance.

The radiative interface is an interface for transmitting signals wirelessly by using antennas, such as a monopole antenna or a planar inverted-F antenna (PIFA). The radiations occur, while electric fields or magnetic fields which change as time passes affect each other. When there are antennas for a same frequency, signals may be received based on polarization characteristics of incident waves.

The induced coupling interface is an interface for forming coupling by making coils, which are formed by winding coils by a plurality of times and then generate a strong magnetic field in a direction, resonating at a similar frequency come close to each other.

The non-radiative interface is an interface using evanescent wave coupling which moves electromagnetic waves between two media resonating at a same frequency via a short-distance electromagnetic field.

Figure 16:
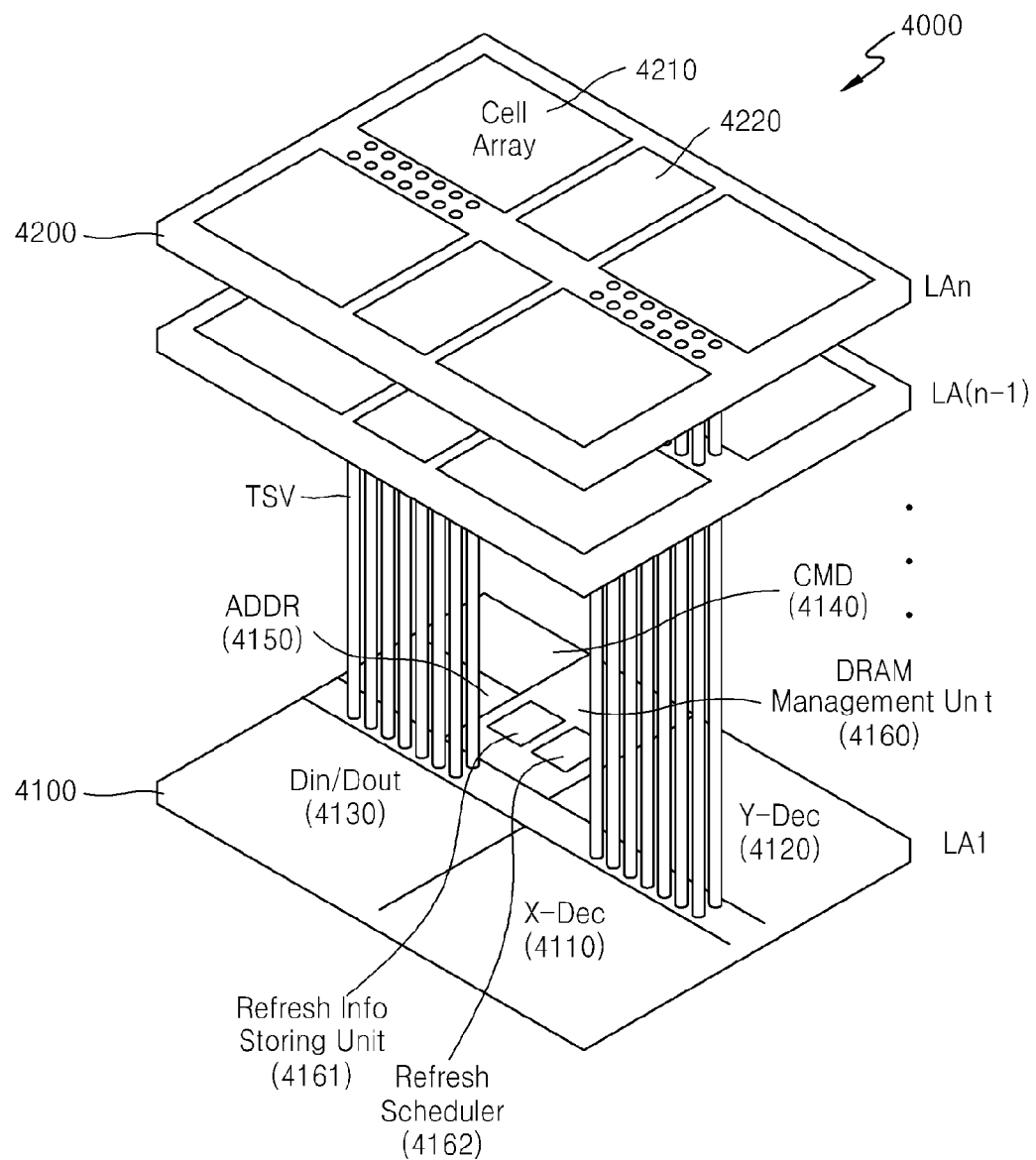
FIG. 16 is an exemplary diagram showing a semiconductor memory device according to one embodiment.

FIG. 16 is an exemplary diagram showing a semiconductor memory device 4000 according to one embodiment. As shown in FIG. 16, the semiconductor memory device 4000 may include a plurality of semiconductor layers LA1 through LAn. Each of the semiconductor layers LA1 through LAn may be a memory chip including DRAM cells. Alternatively, some of the semiconductor layers LA1 through LAn may be master chips for interfacing with external controllers, and the remaining of the semiconductor layers LA1 through LAn may be slave chips for storing data. In the embodiment shown in FIG. 16, it is assumed that the bottommost semiconductor layer LA1 is a master chip and the other semiconductor layers LA2 through LAn are slave chips.

The plurality of semiconductor layers LA1 through LAn transmit and receive signals to and from each other via a through substrate via (e.g., a through silicon via (TSV)), and the master chip LA1 communicates with an external memory controller via a conductive unit (not shown) formed on an outer surface of the master chip LA1. Configuration and operations of the semiconductor memory device 4000 will be described below regarding a first semiconductor layer 4100 as a master chip and an $n^{th}$ semiconductor layer 4200 as a slave chip.

The first semiconductor layer 4100 includes various circuits for driving cell arrays 4210 included in slave chips. For example, the first semiconductor layer 4100 includes a row decoder (X-Dec) 4110 for driving word lines of the cell arrays 4210, a column decoder (Y-Dec) 4120 for driving bit lines of the cell arrays 4210, a data input/output unit 4130 for controlling inputs and outputs of data, a command buffer 4140 for receiving inputs of commands CMD from outside, and an address buffer 4150 which receives inputs of addresses from outside and buffers the addresses.

Furthermore, the first semiconductor layer 4100 may further include a DRAM management unit 4160 for managing memory operations of slave chips. As described above, to adjust refresh periods according to refresh characteristics of cell regions, the DRAM management unit 4160 may include a refresh information storing unit 4161 and a refresh scheduler 4162. The refresh scheduler 4162 may include one or more function blocks for controlling refresh operations from among the components shown in FIG. 6.

For example, the $n^{th}$ semiconductor layer 4200 may include a cell array 4210 and a peripheral circuit region 4220 in which peripheral circuits for driving the cell array 4210 are arranged, e.g., row/column selecting units for selecting rows and columns of the cell array 4210, a bit line sense amplifier (not shown), etc.

Figure 17:
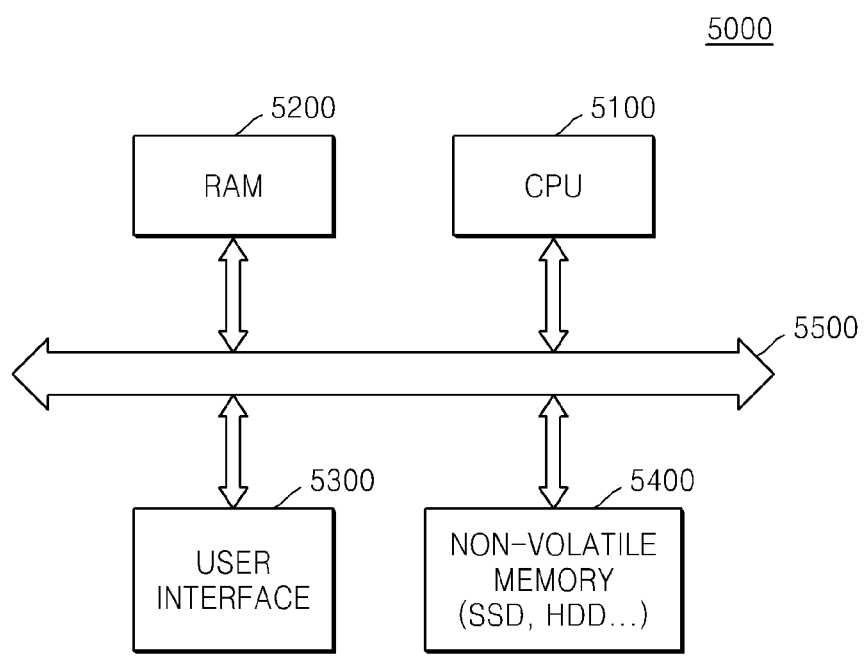
FIG. 17 is an exemplary block diagram showing a computing system including a memory system according to one embodiment.

FIG. 17 is an exemplary block diagram showing a computing system 5000 including a memory system according to one embodiment. The computing system 5000, which is a mobile device or a desktop computer, may include a semiconductor memory device according to one of disclosed embodiments may be installed as a RAM 5200. The semiconductor memory device installed as the RAM 5200 may be any of the semiconductor memory device according to the embodiments described above. For example, the RAM 5200 may be the semiconductor memory device or the memory module according to any of the embodiments described above. Furthermore, the RAM 5200 of FIG. 17 may include both the semiconductor memory device and the memory controller.

The computing system 5000 according to one embodiment includes a central processing unit 5100, the RAM 5200, a user interface 5300, and a non-volatile memory 5400, where the components are electrically connected to a bus 5500. The non-volatile memory 5400 may be a large-capacity storage device, such as a solid-state disc drive (SSD) or a hard disc drive (HDD).

As described above, in the computing system 5000, the RAM 5200 may include a DRAM chip having a cell array for storing data, and the DRAM chip may store refresh period information regarding refresh periods of a plurality of cell regions in the cell array. Alternatively, according to another embodiment, the RAM 5200 may include a separate memory management chip for performing refresh management operations according to retention characteristics of the cell regions, and refresh period information may be stored in the memory management chip.

While the present disclosure has been particularly shown and described with reference to exemplary embodiments thereof, it will be understood that various changes in form and details may be made therein without departing from the spirit and scope of the following claims.

What is claimed is:

1. A semiconductor memory device comprising:
a cell array comprising one or more cell regions each having a plurality of memory cells; and
a refresh information storing unit configured to store first information including a first refresh period, and second information including a second refresh period in correspondence to each of the cell regions,
wherein memory cells included in each of the cell regions are refreshed at the first refresh period according to the first information in a first refresh time band and are refreshed at the second refresh period according to the second information in a second refresh time band.

2. The semiconductor memory device of claim 1, wherein each of the cell regions is a page selectively accessed in response to a row address signal.

3. The semiconductor memory device of claim 1, wherein the first refresh time band is a refresh time band corresponding to a case where memory cells included in each of the cell regions are in a dynamic state, and
wherein the second refresh time band is a refresh time band corresponding to a case where the memory cells included in each of the cell regions are in a static state.

4. The semiconductor memory device of claim 1, wherein the first refresh time band is a refresh time band corresponding to a case where the semiconductor memory device is in an auto-refresh mode, and
wherein the second refresh time band is a refresh time band corresponding to a case where the semiconductor memory device is in a self-refresh mode.

5. The semiconductor memory device of claim 1, further comprising a size information storage unit configured to store a third information regarding sizes of each of the cell regions,
wherein a refresh period of each of the cell regions is adjusted based on the first, second, and third information.

6. The semiconductor memory device of claim 1, wherein retention characteristics of each of the cell regions are categorized into n groups, and
wherein each of the first information and the second information has a value selected from among the n groups.

7. The semiconductor memory device of claim 1, wherein memory cells included in each of the cell regions are refreshed based on either a first address from an internal counter or a second address received from outside the semiconductor memory device, and
wherein a refresh period of each of the cell regions is adjusted based on the number of times that the second address is input to the semiconductor memory device.

8. The semiconductor memory device of claim 1, wherein each of the cell regions is refreshed in response to a signal received from an external controller, and
wherein the first information and the second information corresponding to each of the cell regions are output to outside the semiconductor memory device.

9. The semiconductor memory device of claim 1, wherein the refresh information storing unit includes a fuse array or registers.

10. The semiconductor memory device of claim 1, wherein the first information and the second information are sequentially output in response to a signal from an external controller.

11. A semiconductor memory device comprising:
a cell array comprising one or more cell regions each having a plurality of memory cells;
a refresh information storing unit configured to store information regarding refresh periods corresponding to the respective cell regions;
a refresh counter configured to output a first address for refreshing a first memory cell included in a first cell region of the cell array when the semiconductor memory device receives a first command; and
an address selecting unit configured to select a second address received from outside the semiconductor memory device and to refresh a second memory cell included in a second cell region of the cell array when the semiconductor memory device receives a second command.

12. The semiconductor memory device of claim 11, wherein the second memory cell included in the second cell region is refreshed at least twice during a single refresh period.

13. The semiconductor memory device of claim 12, wherein the cell region of the cell array comprises one or more banks,
wherein the semiconductor memory device is configured to operate in a first configuration, a second configuration, or a third configuration in response to a signal from the memory controller,
wherein in the first configuration, the semiconductor memory device is configured to refresh memory cells of the cell array regardless of the second command,
wherein in the second configuration, the semiconductor memory device is configured to refresh the memory cells of the cell array regardless of bank addresses included in the second address when the second command is received, and wherein in the third configuration, the semiconductor memory device is configured to refresh the memory cells of the cell array in response to both the second command and the second address.

14. The semiconductor memory device of claim 11, wherein the first command indicates an auto-refresh command and the second command indicates a designated refresh command.

15. The semiconductor memory device of claim 11, wherein memory cells included in the first cell region are in a static state and memory cells included in the second cell region are in a dynamic state.

16. A semiconductor memory device comprising:
   a cell array comprising a plurality of cell regions each having a plurality of memory cells; and
   a refresh information storing unit configured to store refresh information including a plurality of retention characteristic values, each retention characteristic value indicating one or more bits,
   wherein memory cells included in a first cell region of the cell regions are refreshed at the first refresh period and memory cells included in a second cell region of the cell regions are refreshed at the second refresh period greater than the first refresh period.

17. The semiconductor memory device of claim 16, wherein each of the first and second cell regions includes at least one page selectively accessed in response to a row address signal.

18. The semiconductor memory device of claim 16, wherein the refresh information is output to a memory controller outside the semiconductor memory device through an input/output path of a data signal DQ.

19. The semiconductor memory device of claim 16, wherein the memory cells to be refreshed are in a dynamic state or in a static state.

20. The semiconductor memory device of claim 16, wherein the memory cells to be refreshed are associated with an auto-refresh mode or a self-refresh mode of the semiconductor memory device.

* * * * *